(12) United States Patent
Matsuoka et al.

(10) Patent No.: US 12,157,793 B2
(45) Date of Patent: Dec. 3, 2024

(54) CURABLE RESIN, CURABLE RESIN COMPOSITION, AND CURED PRODUCT

(71) Applicant: DIC Corporation, Tokyo (JP)

(72) Inventors: Ryuichi Matsuoka, Chiba (JP); Lichen Yang, Chiba (JP); Hiroyoshi Kannari, Chiba (JP)

(73) Assignee: DIC Corporation, Tokyo (JP)

( * ) Notice: Subject to any disclaimer, the term of this patent is extended or adjusted under 35 U.S.C. 154(b) by 3 days.

(21) Appl. No.: 18/021,381

(22) PCT Filed: Jun. 24, 2021

(86) PCT No.: PCT/JP2021/023889
§ 371 (c)(1),
(2) Date: Feb. 14, 2023

(87) PCT Pub. No.: WO2022/038893
PCT Pub. Date: Feb. 24, 2022

(65) Prior Publication Data
US 2024/0052093 A1   Feb. 15, 2024

(30) Foreign Application Priority Data

Aug. 19, 2020 (JP) .................. 2020-138860
Dec. 23, 2020 (JP) .................. 2020-214063

(51) Int. Cl.
| | | |
|---|---|---|
| B32B 3/10 | (2006.01) | |
| C08G 63/193 | (2006.01) | |
| C08G 63/199 | (2006.01) | |
| C08G 63/672 | (2006.01) | |
| C08G 63/81 | (2006.01) | |
| C08G 64/06 | (2006.01) | |
| C08G 64/30 | (2006.01) | |
| C08J 5/24 | (2006.01) | |
| C08K 5/14 | (2006.01) | |
| C08K 5/523 | (2006.01) | |
| C08K 5/5313 | (2006.01) | |

(Continued)

(52) U.S. Cl.
CPC ......... *C08G 63/193* (2013.01); *C08G 63/199* (2013.01); *C08G 63/672* (2013.01); *C08G 63/81* (2013.01); *C08G 64/06* (2013.01); *C08G 64/307* (2013.01); *C08J 5/24* (2013.01); *C08K 5/14* (2013.01); *C08K 5/523* (2013.01); *C08K 5/5313* (2013.01); *C08K 5/5333* (2013.01); *C08L 67/03* (2013.01); *C08L 69/00* (2013.01); *C09D 167/03* (2013.01); *C09D 169/00* (2013.01); *H05K 1/0366* (2013.01); *C08J 2367/03* (2013.01); *C08J 2369/00* (2013.01); *H05K 2201/0145* (2013.01)

(58) Field of Classification Search
None
See application file for complete search history.

(56) References Cited

U.S. PATENT DOCUMENTS

| 4,707,558 A | 11/1987 | Wang et al. |
| 6,043,334 A | 3/2000 | Kanamaru et al. |
| (Continued) | | |

FOREIGN PATENT DOCUMENTS

| JP | S6368537 | 3/1988 |
| JP | S6465110 | 3/1989 |
| (Continued) | | |

OTHER PUBLICATIONS

Machine translation of JP-11255908-A (Year: 1999).*

(Continued)

*Primary Examiner* — Christopher M Polley
(74) *Attorney, Agent, or Firm* — JCIPRNET

(57) ABSTRACT

An object is to provide a cured product and the like with excellent fire retardancy, heat resistance, and dielectric properties by using a curable resin having a specific structure and a curable resin composition containing the curable resin, a radical polymerization initiator, and a fire retardant. Specifically provided are a curable resin represented by General Formula (1) and a curable resin composition containing the curable resin, a radical polymerization initiator (B), and a fire retardant (C):

$$\left[ O \underset{(Rb)_k}{\underset{\big|}{\overset{Ra}{\underset{\big|}{\bigcirc}}}} X \underset{(Rb)_k}{\underset{\big|}{\overset{Ra}{\underset{\big|}{\bigcirc}}}} O - Y \right] \quad (1)$$

in the formula, Ra and Rb each independently represent an alkyl group, an aryl group, an aralkyl group, or a cycloalkyl group with a carbon number of 1 to 12; k indicates an integer of 0 to 3; X represents a hydrocarbon group; and Y represents General Formula (2) or (3) below:

$$\overset{O}{\underset{\|}{-\mathrm{C}-}} \quad (2)$$

$$\overset{O}{\underset{\|}{-\mathrm{C}-}} Z \overset{O}{\underset{\|}{-\mathrm{C}-}} \quad (3)$$

in the formula, Z represents an alicyclic group, an aromatic group, or a heterocyclic group.

6 Claims, No Drawings

(51) Int. Cl.
*C08K 5/5333* (2006.01)
*C08L 67/03* (2006.01)
*C08L 69/00* (2006.01)
*C09D 167/03* (2006.01)
*C09D 169/00* (2006.01)
*H05K 1/03* (2006.01)

(56) References Cited

U.S. PATENT DOCUMENTS

| | | | |
|---|---|---|---|
| 2002/0062001 A1 | 5/2002 | Braat et al. | |
| 2002/0128400 A1 | 9/2002 | Braat et al. | |
| 2003/0229196 A1 | 12/2003 | Braat et al. | |
| 2004/0102583 A1 | 5/2004 | Freshour et al. | |
| 2018/0327541 A1* | 11/2018 | Arita | C08G 59/4223 |

FOREIGN PATENT DOCUMENTS

| | | | | |
|---|---|---|---|---|
| JP | H04298527 | | 10/1992 | |
| JP | 11255908 A | * | 9/1999 | D21H 13/24 |
| JP | 2004276411 A | * | 10/2004 | B32B 15/08 |
| JP | 2006002019 | | 1/2006 | |
| JP | 2007204562 | | 8/2007 | |
| JP | 2009067894 | | 4/2009 | |
| JP | 4320171 | | 8/2009 | |
| JP | 2011021079 | | 2/2011 | |
| JP | 2012097165 A | * | 5/2012 | |
| JP | 2012141605 | | 7/2012 | |
| JP | 2012251039 | | 12/2012 | |
| JP | 2019195137 | | 11/2019 | |
| WO | 9720878 | | 6/1997 | |
| WO | 2016098488 | | 6/2016 | |
| WO | 2020189598 | | 9/2020 | |

OTHER PUBLICATIONS

Machine translation of JP-2004276411-A (Year: 2004).*
Machine translation of JP-2012097165-A (Year: 2012).*
"International Search Report (Form PCT/ISA/210) of PCT/JP2021/023889", mailed on Aug. 24, 2021, with English translation thereof, pp. 1-6.
"Notice of Reasons for Refusal of Japan Counterpart Application", issued on Apr. 5, 2022, with English translation thereof, p. 1-p. 13.
"Decision of Refusal of Japan Counterpart Application", issued on Jun. 14, 2022, with English translation thereof, p. 1-p. 4.
"Notice of Reasons for Refusal of Japan Counterpart Application", issued on Oct. 25, 2022, with English translation thereof, p. 1-p. 27.

* cited by examiner

CURABLE RESIN, CURABLE RESIN COMPOSITION, AND CURED PRODUCT

CROSS-REFERENCE TO RELATED APPLICATION

This application is a 371 application of the International PCT application serial no. PCT/JP2021/023889, filed on Jun. 24, 2021, which claims the priority benefit of Japan Patent Application No. 2020-138860, filed on Aug. 19, 2020 and Japan Patent Application No. 2020-214063, filed on Dec. 23, 2020. The entirety of each of the above-mentioned patent applications is hereby incorporated by reference herein and made a part of this specification.

TECHNICAL FIELD

The present invention relates to a curable resin having a specific structure and a cured product, a varnish, a prepreg, a laminate, and a circuit board obtained by a curable resin composition containing the curable resin, a radical polymerization initiator, and a fire retardant.

BACKGROUND ART

Along with an increase in the volume of information communication in recent years, information communication in high frequency bands has become to be performed vigorously, and electric insulating materials having more excellent electrical properties, in particular, a low dielectric constant and a low dielectric loss tangent have been demanded in order to reduce transmission loss in high frequency bands.

Furthermore, printed boards or electronic components in which these electric insulating materials are used are exposed to high-temperature solder reflow during mounting, and thus materials having excellent heat resistance and indicating a high glass transition temperature are required. Recently in particular, lead-free solders, which have high melting points, have been used from the viewpoint of environmental issues, and thus requirements for electric insulating materials with higher heat resistance have been increasing.

In response to these requirements, curable resins containing vinyl groups having various chemical structures have been conventionally developed. As such curable resins, curable resins such as divinylbenzyl ether of bisphenol and poly (vinylbenzyl) ether of novolac and polyphenylene ether resins containing aliphatic unsaturated bond have been proposed, for example (refer to PTL 1 to PTL 3, for example).

However, these vinylbenzyl ethers cannot give cured products with sufficiently low dielectric properties, and the obtained cured products are problematic for stable use in high frequency bands. Furthermore, divinylbenzyl ether of bisphenol does not have sufficiently high heat resistance.

Thus, conventional curable resins containing vinyl groups including poly(vinylbenzyl) ether do not provide cured products having both a low dielectric loss tangent required for electric insulating materials, especially for electric insulating materials ready for high frequencies, and heat resistance capable of withstanding lead-free soldering.

In addition, fire retardancy is also required for electric insulating materials such as printed circuit boards. However, when a fire retardant is blended in a large amount to satisfy fire retardancy, sufficient fire retardancy and dielectric properties have not simultaneously been achieved, with the dielectric properties being inferior, for example.

CITATION LIST

Patent Literature

PTL 1: Japanese Unexamined Patent Application Publication No. S63-68537
PTL 2: Japanese Unexamined Patent Application Publication No. S64-65110
PTL 3: Japanese Patent No. 4320171

SUMMARY OF INVENTION

Technical Problem

Thus, an object of the present invention is to provide a cured product with excellent fire retardancy, heat resistance (a high glass transition temperature), dielectric properties (low dielectric properties) and a varnish, a prepreg, a laminate, and a circuit board contributing to these properties or having all these properties by using a curable resin having a specific structure and a curable resin composition containing the curable resin, a radical polymerization initiator, and a fire retardant.

Solution to Problem

Thus, in order to achieve the object, the inventors of the present invention have earnestly studied to find out that a curable resin that can contribute to heat resistance and low dielectric properties and a cured product obtained from a curable resin composition containing the curable resin, a radical polymerization initiator, and a fire retardant has excellent fire retardancy, heat resistance, and low dielectric properties to complete the present invention.

That is, the present invention relates to a resin composition having a repeating unit represented by General Formula (1) below and at least one reactive group selected from the group consisting of a (meth)acryloyloxy group, a vinyl benzyl ether group, and an allyl ether group as a terminal structure and a resin composition containing the curable resin, a radical polymerization initiator (B), and a fire retardant (C).

[Chemical Formula 1]

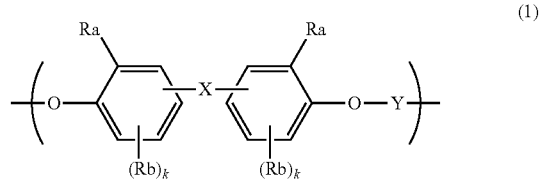

in the formula, Ra and Rb each independently represent an alkyl group, an aryl group, an aralkyl group, or a cycloalkyl group with a carbon number of 1 to 12; k indicates an integer of 0 to 3; X represents a hydrocarbon group; and Y represents General Formula (2) or (3) below:

[Chemical Formula 2]

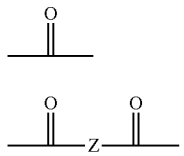

(2)

(3)

in the formula, Z represents an alicyclic group, an aromatic group, or a heterocyclic group.

In the curable resin of the present invention, General Formula (1) above is preferably represented by General Formula (1A) below.

[Chemical Formula 3]

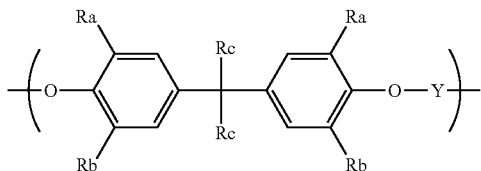

(1A)

In the curable resin of the present invention, Z is preferably a benzene ring.

The curable resin of the present invention preferably has a methacryloyloxy group as the reactive group.

The curable resin of the present invention preferably has a weight average molecular weight of the curable resin of 500 to 50,000.

The curable resin composition of the present invention preferably further contains a curable resin (D) other than the curable resin.

The curable resin composition of the present invention preferably has a dialkyl peroxide-based organic peroxide as the (B) component.

In the curable resin of the present invention, the (C) component preferably contains a phosphorous-based fire retardant represented by any of General Formulae (P-1) to (P-5) below:

[Chemical Formula 4]

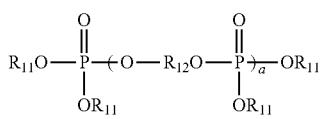

(P-1)

in General Formula (P-1) above, $R_{11}$ each independently represent an alkyl group, an aryl group, an aralkyl group, or a cycloalkyl group with a carbon number of 1 to 12; $R_{12}$ represents an alkylene group or an arylene group; and a indicates an integer of 0 to 3;

[Chemical Formula 5]

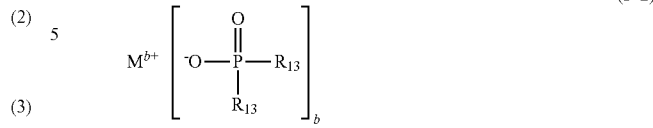

(P-2)

in General Formula (P-2) above, $R_{13}$ each independently represent an alkyl group, an aryl group, an aralkyl group, or a cycloalkyl group with a carbon number of 1 to 12; $M^{b+}$ represents a b-valent metal ion; and b indicates an integer of 1 to 3;

[Chemical Formula 6]

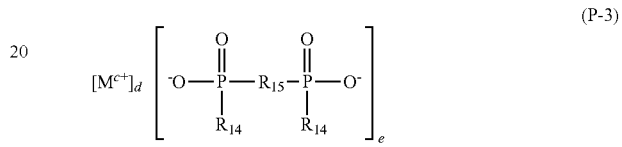

(P-3)

in General Formula (P-3) above, $R_{14}$ each independently represent an alkyl group, an aryl group, an aralkyl group, or a cycloalkyl group with a carbon number of 1 to 12; $R_{15}$ represents an alkylene group or an arylene group; $M^{c+}$ represents a c-valent metal ion; and c, d, and e each independently indicate an integer of 1 to 3 and satisfy $c \times d = 2 \times e$;

[Chemical Formula 7]

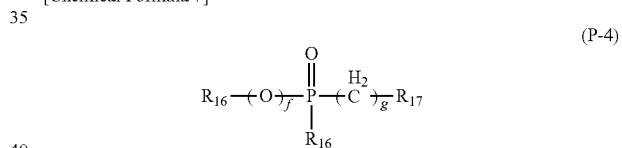

(P-4)

in General Formula (P-4) above, $R_{16}$ each independently represent an alkyl group, an aryl group, an aralkyl group, or a cycloalkyl group with a carbon number of 1 to 12 and may form a cyclic structure together with a phosphorus atom; $R_{17}$ represents a vinyl group, a vinylbenzyl group, or a (meth)acryloyloxy group; and f and g each independently indicate 0 or 1;

[Chemical Formula 8]

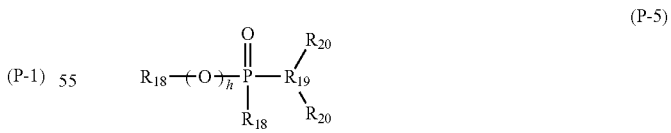

(P-5)

in General Formula (P-5) above, $R_{18}$ each independently represent an alkyl group, an aryl group, an aralkyl group, or a cycloalkyl group with a carbon number of 1 to 12 and may form a cyclic structure together with a phosphorus atom; $R_{19}$ represents a divalent group having an arylene structure; $R_{20}$ represents a (meth)acryloyloxy group, a vinyl benzyl ether group, or an allyl ether group; and h indicates 0 or 1.

The curable resin composition of the present invention preferably has, as the (D) component, at least one curable resin selected from the group consisting of epoxy resins, phenolic resins, active ester resins, cyanate ester resins, maleimide resins, benzoxazine resins, polyphenylene ether resins, and vinyl resins.

The present invention relates to a cured product obtained by subjecting the curable resin composition to a curing reaction.

The present invention relates to a varnish obtained by diluting the curable resin composition with an organic solvent.

The present invention relates to a prepreg having a reinforcing base material and a semi-cured product of the varnish impregnated into the reinforcing base material.

The present invention relates to a laminate having a base material and a layer containing the cured product.

The present invention relates to a circuit board obtained by laminating and thermocompression molding the prepreg and copper foil to each other.

Advantageous Effects of Invention

The curable resin of the present invention has excellent heat resistance and low dielectric properties and the cured product obtained by the curable resin composition containing the curable resin, the radical polymerization initiator, and the fire retardant has excellent fire retardancy, heat resistance, and low dielectric properties and is thus useful.

DESCRIPTION OF EMBODIMENTS

The following describes the present invention in detail.

Curable Resin

The curable resin of the present invention relates to a curable resin having a repeating unit represented by General Formula (1) below and at least one reactive group (cross-linking group) selected from the group consisting of a (meth)acryloyloxy group, a vinyl benzyl ether group, and an allyl ether group as a terminal structure. In the following, the curable resin having a repeating unit represented by General Formula (1) below and at least one reactive group (cross-linking group) selected from the group consisting of a (meth)acryloyloxy group, a vinyl benzyl ether group, and an allyl ether group as a terminal structure is called a curable resin (A) (also referred to as an "(A) component").

[Chemical Formula 9]

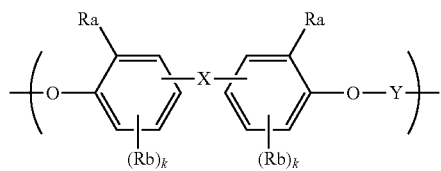

(1)

in General Formula (1) above, Ra and Rb each independently represent an alkyl group, an aryl group, an aralkyl group, or a cycloalkyl group with a carbon number of 1 to 12; k indicates an integer of 0 to 3; X represents a hydrocarbon group; and Y represents General Formula (2) or (3) below:

[Chemical Formula 10]

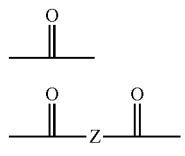

(2)

(3)

In General Formula (3) above, Z represents an alicyclic group, an aromatic group, or a heterocyclic group.

By the (A) component having a repeating unit represented by General Formula (1) above and at least one reactive group (cross-linking group) selected from the group consisting of a (meth)acryloyloxy group, a vinyl benzyl ether group, and an allyl ether group as a terminal structure, low dielectric properties (especially a low dielectric loss tangent) are achieved because the ester bond or the carbonate bond contained in the (A) component has lower molecular mobility than an ether bond or the like, and furthermore, by Ra and Rb (especially Ra) as substituents being present at positions adjacent to the reactive group (cross-linking group), the polarity derived from the reactive group (cross-linking group) is constrained by the steric hindrance of Ra to give a cured product with a lower dielectric loss tangent, which is preferred. In addition, the (A) component having the reactive group (cross-linking group) provides the obtained cured product with excellent heat resistance, and furthermore, having the ester bond or the carbonate bond with lower molecular mobility can obtain a cured product having not only low dielectric properties but also a high glass transition temperature.

In General Formula (1) above, Ra and Rb each independently represent an alkyl group, an aryl group, an aralkyl group, or a cycloalkyl group with a carbon number of 1 to 12 and is preferably an alkyl group, an aryl group, or a cycloalkyl group with a carbon number of 1 to 4. Ra and Rb being an alkyl group with a carbon number of 1 to 12 or the like reduce the planarity in the vicinity of the benzene ring in General Formula (1) above, and reduced crystallinity improves solvent solubility and lowers the melting point, which is a preferred mode. In addition, by Ra and Rb (especially Ra) as substituents being present at the positions adjacent to the reactive group (cross-linking group), the polarity derived from the reactive group (cross-linking group) is constrained by the steric hindrance of Ra to give a cured product with a lower dielectric loss tangent, which is preferred.

In General Formula (1) above, k indicates an integer of 0 to 3 and is preferably an integer of 0 or 1. By k being within the above range, the planarity in the vicinity of the benzene ring in General Formula (1) above reduces, and reduced crystallinity improves solvent solubility and lowers the melting point, which is a preferred mode. When k is not 0, that is, when Rb as the substituent is present and is present in the vicinity of the reactive group (cross-linking group), the polarity derived from the reactive group (cross-linking group) is constrained by the steric hindrance of Rb, and a cured product with a low dielectric loss tangent can be obtained, which is preferred.

In General Formula (1) above, X may be any hydrocarbon group, but it is preferred to be represented by the structures of General Formulae (4) to (6) below from the viewpoint of ease of obtaining industrial raw materials, and especially the structure of General Formula (4) below is more preferred because of its good balance of heat resistance and low dielectric properties:

[Chemical Formula 11]

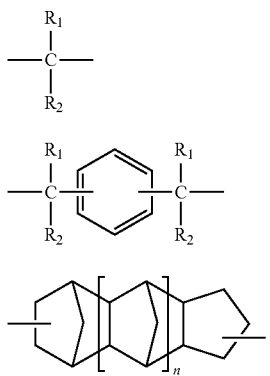

(4)

(5)

(6)

In General Formulae (4) to (6) above, $R_1$ and $R_2$ are each independently represented by a hydrogen atom, an alkyl group, an aryl group, an aralkyl group, or a cycloalkyl group with a carbon number of 1 to 12 or $R_1$ and $R_2$ may be bonded together to form a cyclic skeleton. The letter n indicates an integer of 0 to 2 and is preferably an integer of 0 or 1. By n being within the above range, high heat resistance is achieved, which is a preferred mode.

In General Formula (1) above, Y is represented by General Formula (2) or (3) above and, from the viewpoint of heat resistance, is preferably General Formula (2) above.

In General Formula (3) above, Z is represented by an alicyclic group, an aromatic group, or a heterocyclic group in order to obtain a cured product with high heat resistance and is preferably a structure represented by General Formulae (7) to (11) below. From the viewpoint of cost and heat resistance, especially the structure of General Formula (7) below (a benzene ring) is more preferred:

[Chemical Formula 12]

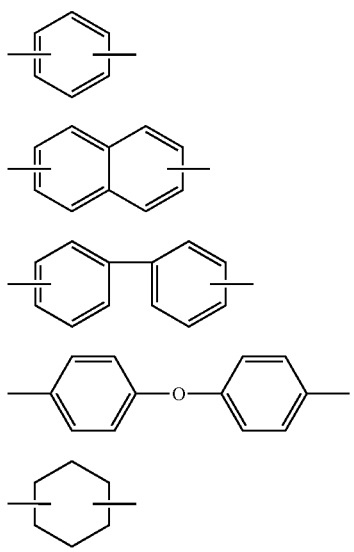

(7)

(8)

(9)

(10)

(11)

The (A) component has at least one reactive group (cross-linking group) selected from the group consisting of a (meth)acryloyloxy group, a vinyl benzyl ether group, and an allyl ether group as a terminal structure. Preferably, as the terminal structure, the methacryloyloxy group is more preferred in that the obtained cured product has a low dielectric loss tangent. The methacryloyloxy group forms an ester bond, whereas the vinyl benzyl ether group and the allyl ether group form an ether bond, which tends to have higher molecular mobility and a higher dielectric loss tangent.

In the curable resin of the present invention, General Formula (1) above is preferably a repeating unit represented by General Formula (1A) below and the reactive group is preferably a methacryloyloxy group. Having a methacryloyloxy group as the terminal structure is preferable because the obtained cured product has a low dielectric loss tangent.

[Chemical Formula 13]

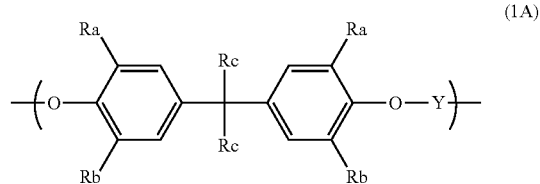

(1A)

In General Formula (1A) above, Rc preferably represents a hydrogen atom or a methyl group and is more preferably a hydrogen atom. Rc being the hydrogen atom or the like provides low polarity, which is a preferred mode. In General Formula (3) above, Ra, Rb, and Y are the same as in General Formula (1) above.

The (A) component is characterized in that it has a repeating unit represented by General Formula (1) above (or a repeating unit represented by General Formula (1A) above) and a reactive group (cross-linking group) as a terminal structure and may contain other repeating units (structures) to the extent that the properties of the (A) component are not impaired.

The (A) component has a weight average molecular weight (Mw) of preferably 500 to 50,000, more preferably 1,000 to 10,000, and even more preferably 1,500 to 5,000. Being within the above range improves solvent solubility and makes processing workability favorable, which is preferred.

Method for Producing Curable Resin (A)

The following describes a method for producing the (A) component.

Examples of the method of production include a method of reaction in an organic solvent such as an interfacial polymerization method and a method of reaction in a molten state such as melt polymerization.

Interfacial Polymerization Method

Examples of the interfacial polymerization method include a method of mixing a solution (an organic phase) in which a divalent carboxylic acid halide and a cross-linking group introducing agent used to introduce a reactive group (a cross-linking group) as a terminal structure are dissolved in an organic solvent incompatible with water with an aqueous alkaline solution (an aqueous phase) containing a divalent phenol, a polymerization catalyst, and an antioxidant and performing a polymerization reaction while stirring them at a temperature of 50° C. or lower for 1 to 8 hours.

Examples of another interfacial polymerization method include a method of blowing phosgene into a mixture of a solution (an organic phase) in which a cross-linking group introducing agent used to introduce a reactive group (a cross-linking group) as a terminal structure is dissolved in an organic solvent incompatible with water and an aqueous alkaline solution (an aqueous phase) containing a divalent phenol, a polymerization catalyst, and an antioxidant and performing a polymerization reaction while stirring them at a temperature of 50° C. or lower for 1 to 8 hours.

The organic solvent for use in the organic phase is preferably a solvent that is incompatible with water and dissolves polyarylate. Examples of such a solvent include chlorinated solvents such as methylene chloride, 1,2-dichloroethane, chloroform, carbon tetrachloride, chlorobenzene, 1,1,2,2-tetrachloroethane, 1,1,1-trichloroethane, and o-, m-, p-dichlorobenzene, aromatic hydrocarbons such as toluene, benzene, and xylene, and tetrahydrofuran. Methylene chloride is preferred because of its ease of use in production.

Examples of the aqueous alkaline solution for use in the aqueous phase include an aqueous solution of sodium hydroxide and an aqueous solutions of potassium hydroxide.

The antioxidant is used in order to prevent oxidation of the divalent phenol component. Examples of the antioxidant include sodium hydrosulfite, L-ascorbic acid, erythorbic acid, catechin, tocopherol, and butylated hydroxyanisole. Among them, sodium hydrosulfite is preferred because of its excellent water solubility.

Examples of the polymerization catalyst include quaternary ammonium salts such as tri-n-butylbenzylammonium halides, tetra-n-butylammonium halides, trimethylbenzylammonium halides, and triethylbenzylammonium halides; and quaternary phosphonium salts such as tri-n-butylbenzylphosphonium halides, tetra-n-butylphosphonium halides, trimethylbenzylphosphonium halides, and triethylbenzylphosphonium halides. Among them, preferred are tri-n-butylbenzylammonium halides, trimethylbenzylammonium halides, tetra-n-butylammonium halides, tri-n-butylbenzylphosphonium halides, and tetra-n butylphosphonium halides because they have high molecular weights and can obtain polymers with low acid values.

The amount of the polymerization catalyst added is preferably 0.01 to 5.0 mol % and more preferably 0.1 to 1.0 mol % with respect to the number of moles of the divalent phenol used for polymerization. When the amount of the polymerization catalyst added is 0.01 mol % or more, the effect of the polymerization catalyst is obtained, and the molecular weight of the polyarylate resin is higher, which is preferred. On the other hand, when the amount is 5.0 mol % or less, the hydrolysis reaction of divalent aromatic carboxylic acid halides is inhibited, and the molecular weight of the polyarylate resin is higher, which is preferred.

Examples of the divalent phenol include 2,2-bis(4-hydroxy-3,5-dimethylphenyl)propane, 2,2-bis(4-hydroxy-3,6-dimethylphenyl)propane, 2,2-bis(3-methyl-4-hydroxyphenyl)propane, 2,2-bis(4-hydroxy-3,5,6-trimethylphenyl)propane, 2,2-bis(4-hydroxy-2,3,6-trimethylphenyl)propane, bis(4-hydroxy-3,5-dimethylphenyl)methane, bis(4-hydroxy-3,6-dimethylphenyl)methane, bis(4-hydroxy-3-methylphenyl)methane, bis(4-hydroxy-3,5,6-trimethylphenyl)methane, bis(4-hydroxy-2,3,6-trimethylphenyl)methane, 1,1-bis(4-hydroxy-3,5-dimethylphenyl)-1-phenylethane, 2,2-bis(4-hydroxy-3,5-dimethylphenyl)butane, bis(4-hydroxy-3,5-dimethylphenyl)diphenylmethane, 2,2-bis(4-hydroxy-3-isopropylphenyl)propane, 1,1-bis(4-hydroxy-3,5-dimethylphenyl)ethane, 1,3-bis(2-(4-hydroxy-3,5-dimethylphenyl)-2-propyl)benzene, 1,4-bis(2-(4-hydroxy-3,5-dimethylphenyl)-2-propyl)benzene, 1,1-bis(4-hydroxy-3,5-dimethylphenyl)-3,3,5-trimethylcyclohexane, 1,1-bis (4hydroxy-3,5-dimethylphenyl)cyclohexane, 2,2-bis(2-hydroxy-5-biphenylyl)propane, and 2,2-bis(4-hydroxy-3-cyclohexyl-6-methylphenyl)propane.

Examples of the divalent carboxylic acid halide include terephthaloyl halides, isophthaloyl halides, orthophthaloyl halides, diphenoyl halides, biphenyl-4,4'-dicarboxylic acid halides, 1,4-naphthalenedicarboxilic acid halides, 2,3-naphthalenedicarboxylic acid halides, 2,6-naphthalenedicarboxylic acid halides, 2,7-naphthalenedicarboxylic acid halides, 1,8-naphthalenedicarboxylic acid halides, 1,5-naphthalenedicarboxylic acid halides, diphenyl ether-2,2'-dicarboxylic acid halides, diphenyl ether-2,3'-dicarboxylic acid halides, diphenyl ether-2,4'-dicarboxylic acid halides, diphenyl ether-3,3'-dicarboxylic acid halides, diphenyl ether-3,4'-dicarboxylic acid halides, diphenyl ether-4,4'-dicarboxylic acid halides, 1,4-cyclohexanedicarboxylic acid halides, and 1,3-cyclohexanedicarboxilic acid halides.

As the terminal structure of the (A) component, at least one reactive group selected from the group consisting of a (meth)acryloyloxy group, a vinyl benzyl ether group, and an allyl ether group is included, in which a cross-linking group introducing agent can be used in order to introduce these reactive groups (cross-linking groups). As the cross-linking group introducing agent, (meth)acrylic anhydride, (meth) acryloyl chloride, chloromethylstyrene, chlorostyrene, allyl chloride, allyl bromide, or the like can be reacted, for example. From the viewpoint that a cured product obtained by a curable resin composition containing a curable resin into which a methacryloyloxy group is introduced as the terminal structure in particular has a low dielectric loss tangent, it is more preferable to use (meth)acrylic anhydride or (meth)acryloyl chloride. By reacting together these compounds, a reactive group can be introduced to the curable resin, which can produce a cured product with a low dielectric constant and a low dielectric loss tangent, which is a preferred mode.

Examples of the (meth)acrylic anhydride include acrylic anhydride and methacrylic anhydride. Examples of the (meth)acryloyl chloride include methacryloyl chloride and acryloyl chloride. Examples of chloromethylstyrene include p-chloromethylstyrene and m-chloromethylstyrene, and examples of chlorostyrene include p-chlorostyrene and m-chlorostyrene. Examples of allyl chloride include 3-chloro-1-propene, and examples of allyl bromide include 3-bromo-1-propene. These may each be used alone or used by being mixed together. Among them, methacrylic anhydride or methacryloyl chloride, which can produce a cured product with a much lower dielectric loss tangent, is particularly preferably used.

Melt Polymerization Method

Examples of the melt polymerization method include a method of acetylating a raw material divalent phenol and then performing deacetic acid polymerization of the acetylated divalent phenol and a divalent carboxylic acid and a method of performing an ester exchange reaction of a divalent phenol and a carbonate.

In the acetylation reaction, an aromatic dicarboxylic acid component, a divalent phenol component, and acetic anhydride are fed into a reaction vessel. Then, nitrogen purging is performed, and the mixture is stirred in the inert atmosphere, at a temperature of 100 to 240° C. and preferably 120 to 180° C., for 5 minutes to 8 hours and preferably 30 minutes to 5 hours, under normal pressure or pressurized pressure. The molar ratio of acetic anhydride to the hydroxy group of the divalent phenol component is preferably 1.00 to 1.20.

The deacetic acid polymerization reaction is a reaction reacting the acetylated divalent phenol and the divalent carboxylic acid to subject them to polycondensation. In the deacetic acid polymerization reaction, the temperature is maintained at 240° C. or higher, preferably 260° C. or higher, and more preferably 280° C. or higher for 30 minutes or longer at a degree of depressurization of 500 Pa or lower, preferably 260 Pa or lower, and more preferably 130 Pa or lower with stirring. When the temperature is 240° C. or higher, when the degree of depressurization is 500 Pa or lower, or when the holding time is 30 minutes or longer, the deacetic acid reaction sufficiently proceeds to reduce the amount of acetic acid in the obtained polyarylate resin, shorten the overall polymerization time, and prevent deterioration of polymer color tone.

In the acetylation reaction and the deacetic acid polymerization reaction, it is preferable to use a catalyst as needed. Examples of the catalyst include organotitanate compounds such as tetrabutyl titanate; zinc acetate; alkali metal salts such as potassium acetate; alkaline earth metal salts such as magnesium acetate; antimony trioxide; organotin compounds such as hydroxybutyl tin oxide and tin octylate; and heterocyclic compounds such as N-methylimidazole. The amount of the catalyst added is usually 1.0 mol % or less, more preferably 0.5 mol % or less, and even more preferably 0.2 mol % or less with respect to the total monomer component of the obtained polyarylate resin.

In the ester exchange reaction, the reaction is carried out at a temperature of 120 to 260° C. and preferably 160 to 200° C. for 0.1 to 5 hours and preferably 0.5 to 6 hours at a pressure of normal pressure to 1 Torr.

As the catalyst for the ester exchange reaction, salts of zinc, tin, zirconium, and lead are preferably used, for example, which can be used alone or in combination. Specific examples of the ester exchange reaction catalyst include zinc acetate, zinc benzoate, zinc 2-ethyl hexanoate, tin(II) chloride, tin(IV) chloride, tin(II) acetate, tin(IV) acetate, dibutyl tin dilaurate, dibutyl tin oxide, dibutyl tin dimethoxide, zirconium acetylacetonate, zirconium oxyacetate, zirconium tetrabutoxide, lead(II) acetate, and lead(IV) acetate. These catalysts are used at a ratio of 0.000001 to 0.1 mol % and preferably 0.00001 to 0.1 mol % with respect to a total of 1 mol of the divalent phenol.

As the divalent phenol, the divalent phenol in the interfacial polymerization method described above can be used in the same manner.

Examples of the divalent carboxylic acid include terephthalic acid, isophthalic acid, orthophthalic acid, diphenic acid, biphenyl-4,4'-dicarboxylic acid, 1,4-naphthalenedicarboxylic acid, 2,3-naphthalenedicarboxylic acid, 2,6-naphthalenedicarboxylic acid, 2,7-naphthalenedicarboxylic acid, 1,8-naphthalenedicarboxylic acid, 1,5-naphthalenedicarboxylic acid, diphenyl ether-2,2'-dicarboxylic acid, diphenyl ether-2,3'-dicarboxylic acid, diphenyl ether-2,4'-dicarboxylic acid, diphenyl ether-3,3'-dicarboxylic acid, diphenyl ether-3,4'-dicarboxylic acid, diphenyl ether-4,4'-dicarboxylic acid, 1,4 cyclohexanedicarboxylic acid, and 1,3-cyclohexanedicarboxylic acid.

Examples of the carbonate include diphenyl carbonate, ditolyl carbonate, bis(chlorophenyl) carbonate, m-cresol carbonate, dinaphthyl carbonate, bis(diphenyl) carbonate, diethyl carbonate, dimethyl carbonate, dibutyl carbonate, and dicyclohexyl carbonate.

As the terminal structure of the (A) component, at least one reactive group selected from the group consisting of a (meth)acryloyloxy group, a vinyl benzyl ether group, and an allyl ether group is included, in which a cross-linking group introducing agent can be used in order to introduce these reactive groups (cross-linking groups). As the cross-linking group introducing agent, the cross-linking group introducing agent in the interfacial polymerization method described above can be used in the same manner.

The present invention relates to a curable resin composition containing the curable resin (A) and a radical polymerization initiator (B) and a fire retardant (C), which are described below. The curable resin has excellent solvent solubility, and thus the curable resin composition is easy to prepare and has excellent handleability. The curable resin composition can contribute to fire retardancy, heat resistance, and low dielectric properties and is useful.

Curable Resin (D)

The curable resin composition of the present invention preferably further contains a curable resin (D) (also referred to as a "(D) component") other than the (A) component. By using the curable resin composition containing the (D) component, a cured product imparted with properties based on the respective curable resins can be obtained, which is a preferred mode.

From the viewpoints of high heat resistance, high adhesiveness, low thermal expansion, and miscibility, the (D) component is preferably at least one curable resin selected from the group consisting of epoxy resins, phenolic resins, active ester resins, cyanate ester resins, maleimide resins, benzoxazine resins, polyphenylene ether resins, and vinyl resins.

Examples the epoxy resins include dicyclopentadiene type epoxy resins, bisphenol A type epoxy resins, bisphenol F type epoxy resins, bisphenol S type epoxy resins, phenol novolac type epoxy resins, cresol novolac type epoxy resins, bisphenol A novolac type epoxy resins, salicylaldehyde novolac type epoxy resins, bisphenol F novolac type epoxy resins, alicyclic epoxy resins, glycidyl ester type epoxy resins, glycidylamine type epoxy resins, hydantoin type epoxy resins, isocyanurate type epoxy resins, aliphatic cyclic epoxy resins, their halides and hydrogenated products, and one or two or more mixtures selected from mixtures of the above resins.

Examples of the phenolic resins include phenol novolac, o-cresol novolac, p-cresol novolac, t-butylphenol novolac, dicyclopentadiene cresol, poly-p-vinylphenol, bisphenol A type novolac, phenol aralkyl resins, naphthol aralkyl resins, biphenyl type phenol novolac resins, biphenyl type naphthol novolac resins, decalin-modified novolac, poly(di-o-hydroxyphenyl)methane, poly(di-m-hydroxyphenyl)methane, and poly(di-p-hydroxyphenyl)methane.

Examples of the active ester resins include active ester compounds obtained by reacting a carboxylic acid compound and/or a thiocarboxylic acid compound and a hydroxy compound and/or a thiol compound with each other, for example.

Examples of the cyanate ester resins include bis(4-cyanatophenyl)ethane, 2,2-bis(4-cyanatophenyl)propane, 2,2-bis(3,5-dimethyl-4-cyanatophenyl)methane, 2,2-bis(4-cyanatophenyl)-1,1,1,3,3,3-hexafluoropropane, α,α'-bis(4- cyanatophenyl)-m-diisopropylbenzene, and cyanate esters of phenol-added dicyclopentadiene polymers.

Examples of the maleimide resins include 4,4'-diphenylmethane bismaleimide, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, and 1,6'-bismaleimide-(2,2,4-trimethyl)hexane.

Examples of the benzoxazine resins include Fa type benzoxazine compounds obtained by the reaction of a bisphenol compound and an amine compound (aniline, for example), such as bisphenol A type benzoxazine compounds and bisphenol F type benzoxazine compounds and Pd type benzoxazine compounds obtained by the reaction of a phenyldiamine compound and a phenol compound, such as diaminodiphenylmethane type benzoxazine compounds.

Examples of the polyphenylene ether resins include poly(2,6-dimethyl-1,4-phenylene) ether, a polymer alloy of poly(2,6-dimethyl-1,4-phenylene) ether and polystyrene, and an alloyed polymer of poly(2,6-dimethyl-1,4-phenylene) ether and a styrene-butadiene copolymer.

Examples of the vinyl resins include trialkenyl isocyanurate compounds such as triallyl isocyanurate, polybutadiene resins repeating units of which are 1,2-butadiene, cis-1,4-butadiene, and trans-1,4-butadiene, styrene having a vinylbenzyl group in the molecule, and vinylbenzyl compounds such as divinylbenzene.

As the (D) component, maleimide resins, cyanate ester resins, polyphenylene ether resins, and vinyl resins are particularly preferred because they reduce the dielectric loss tangent.

The curable resin composition of the present invention preferably contains the (D) component in an amount of 0 to 80 parts by mass and more preferably contains it in an amount of 0 to 60 parts by mass with respect to 100 parts by mass of the (A) component. The (D) component can be blended to the extent that it does not impair the properties of the present invention and can be used as appropriate when properties caused by the (D) component are desired to be imparted to the extent that it does not exceed the (A) component.

Radical Polymerization Initiator (B)

The curable resin composition of the present invention contains the radical polymerization initiator (B) (also referred to as a "(B) component"). By using the curable resin composition containing the (B) component, the reactivity improves, the residue of low molecular weight components is reduced, and a cured product with excellent heat resistance can be obtained, which is a preferred mode.

Examples of the (B) component include isobutylperoxide, α,α'-bis(neodecanoylperoxy)diisopropylbenzene, cumylperoxyneodecanoate, di-n-propylperoxydicarbonate, 1,1,3,3-tetramethylbutylperoxy neodecanoate, diisopropylperoxydicarbonate, 1-cyclohexyl-1-methylethylperoxy neodecanoate, di-2-ethoxyethylperoxydicarbonate, di(2-ethylhexylperoxy)dicarbonate, t-hexylperoxydecanoate, dimethoxybutylperoxy didecanoate, di(3-methyl-3-methoxybutylperoxy)dicarbonate, t-butylperoxyneodecanoate, t-hexylperoxypivalate, t-butylperoxypivalate, 3,5,5-trimethylhexanoyl peroxide, octanoyl peroxide, 1,1,3,3-tetramethylbutylperoxy-2-ethylhexanoate, 2,5-dimethyl-2,5-di(2-ethylhexanoylperoxy)hexane, 1-cyclohexyl-1-methylethylperoxy-2-ethylhexanoate, t-hexylperoxy-2-ethylhexanoate, t-butylperoxy-2-ethylhexanoate, m-toluoyl peroxide, t-butylperoxyisobutyrate, 1,1-bis(t-butylperoxy) cyclohexane, α,α'-bis(t-butylperoxy)diisopropylbenzene, dicumylperoxide, 2,5-dimethyl-2,5-di(t-butylperoxy) hexane, t-butylcumylperoxide, di-t-butyl peroxide, 2,5-dimethyl-2,5-di(t-butylperoxy)hexyne-3, t-butyltrimethylsilyl peroxide, and 2,3-dimethyl-2,3-diphenylbutane. In particular, dialkyl peroxide-based organic peroxides are preferred because they improve cross-linking density. Among them, more preferably used are α,α'-bis(t-butylperoxy)diisopropylbenzene, dicumylperoxide, 2,5-dimethyl-2,5-di(t-butylperoxy)hexane, t-butylcumylperoxide, di-t-butyl peroxide, and 2,5-dimethyl-2,5-di(t-butylperoxy)hexyne-3.

The curable resin composition of the present invention preferably contains the (B) component in an amount of 0.05 to 30 parts by mass, more preferably contains it in an amount of 0.1 to 20 parts by mass, and even more preferably contains it in an amount of 0.5 to 10 parts by mass with respect to 100 parts by mass of the (A) component. When the content of the (B) component is 0.05 part by mass or more, a cured product that is sufficiently cured can be obtained, and when the content is 30 parts by mass or less, deterioration of dielectric properties can be inhibited, which is preferred.

Fire Retardant (C)

The curable resin composition of the present invention contains the fire retardant (C) (also referred to as a "(C) component"). Cured products obtained by using the curable resin composition containing the (C) component have excellent fire retardancy, which is a preferable mode.

The (C) component can be used without particular limitations. Examples thereof include phosphorus-based fire retardants, nitrogen compounds, silicone-based fire retardants, metal hydroxides, and polysilanes. As the phosphorus-based fire retardants, preferred are organophosphorus-based fire retardants, reactive organophosphorus-based fire retardants, and organic nitrogen-containing phosphorus compounds.

Examples of the organophosphorus-based fire retardants include phenanthrene-type phosphorus compounds such as HCA, HCA-HQ, and HCA-NQ manufactured by Sanko Co., Ltd.; phosphorus-containing benzoxazine compounds such as HFB-2006M manufactured by Showa Highpolymer Co. Ltd.; phosphate compounds such as Rheophos 30, 50, 65, 90, 110, TPP, RPD, BAPP, CPD, TCP, TXP, TBP, TOP, KP140, and TIBP manufactured by Ajinomoto Fine-Techno Co., Inc., FP-800 and FP-600 manufactured by ADEKA Corporation, PPQ manufactured by Hokko Chemical Industry Co., Ltd., and PX-200 manufactured by Daihachi Chemical Industry Co., Ltd.; organic phosphinates such as OP930, OP935, and OP945 manufactured by Clariant; phosphorus-containing epoxy resins such as FX289 and FX305 manufactured by Tohto Kasei Co., Ltd.; phosphorus-containing phenoxy resins such as ERF001 manufactured by Tohto Kasei Co., Ltd.; and phosphorus-containing epoxy resins such as YL7613 manufactured by Japan Epoxy Resin Co., Ltd.

Examples of the reactive organophosphorus-based fire retardants include MC-2, MC-4, S-2, S-4, V1, V2, V3, V4, V5, W-1o, W-2h, W-2o, W-3o, and W-4o manufactured by Katayama Chemical Industries Co., Ltd.

Examples of the organic nitrogen-containing phosphorus compounds include phosphate amide compounds such as SP670 and SP703 manufactured by Shikoku Chemicals Corporation, SPB100 and SPE100 manufactured by Otsuka Chemical Co., Ltd., and phosphazene compounds such as FP-series manufactured by Fushimi Pharmaceutical Co., Ltd.

Examples of the metal hydroxides include magnesium hydroxide such as UD65, UD650, and UD653 manufactured by Ube Material Industries, Ltd. and aluminum hydroxide such as B-30, B-325, B-315, B-308, B-303, and UFH-20 manufactured by Tomoe Engineering Co., Ltd. Examples of polysilanes include SI-10, SI-20, and SI-30 manufactured by Osaka Gas Chemicals Co., Ltd.

General fire retardants tend to give a high dielectric loss tangent by using them. As the (C) component, from the viewpoint of being able to reduce the dielectric loss tangent in particular, preferably used are phosphate compounds such as PX-200 manufactured by Daihachi Chemical Industry Co., Ltd., organic phosphinates such as OP930, OP935, and OP945 manufactured by Clariant, and reactive organophosphorous-based fire retardants such as MC-2, MC-4, S-2, S-4, V1, V2, V3, V4, V5, W-1o, W-2h, W-2o, W-3o, and W-4o manufactured by Katayama Chemical Industries Co., Ltd.

In addition, the (C) component preferably contains a phosphorus-based fire retardant represented by any of General Formulae (P-1) to (P-5) below:

[Chemical Formula 14]

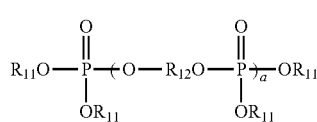
(P-1)

in General Formula (P-1) above, $R_{11}$ each independently represent an alkyl group, an aryl group, an aralkyl group, or a cycloalkyl group with a carbon number of 1 to 12 and, in view of a low dielectric loss tangent, are each independently preferably a phenyl group having substituents at the 2,6-positions, and are each independently particularly preferably a 2,6-dimethyl phenyl group. $R_{12}$ represents an alkylene group or an arylene group and, in view of heat resistance, is preferably a phenylene group. The letter a indicates an integer of 0 to 3 and, in view of fire retardancy, is preferably 0 or 1.

[Chemical Formula 15]

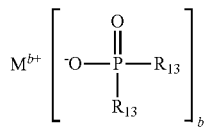
(P-2)

in General Formula (P-2) above, $R_{13}$ each independently represent an alkyl group, an aryl group, an aralkyl group, or a cycloalkyl group with a carbon number of 1 to 12 and, in view of a low dielectric constant, are each independently preferably a methyl group, an ethyl group, a propyl group, a butyl group, a cyclohexyl group, a benzyl group, or a phenyl group. $M^{b+}$ represents a b-valent metal ion, and examples of the metal includes aluminum, magnesium, sodium, potassium, and calcium. In view of fire retardancy, aluminum is preferred. The letter b indicates an integer of 1 to 3 and, in view of fire retardancy, is preferably 3.

[Chemical Formula 16]

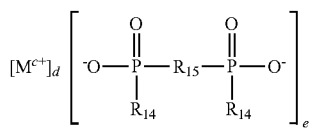
(P-3)

In General Formula (P-3) above, $R_{14}$ each independently represent an alkyl group, an aryl group, an aralkyl group, or a cycloalkyl group with a carbon number of 1 to 12 and, in view of a low dielectric constant, are each independently preferably a methyl group, an ethyl group, a propyl group, a butyl group, a cyclohexyl group, a benzyl group, or a phenyl group. $R_{15}$ represents an alkylene group or an arylene group and, in view of heat resistance, is preferably a phenylene group. $M^{c+}$ represents a c-valent metal ion, and examples of the metal includes aluminum, magnesium, sodium, potassium, and calcium. In view of fire retardancy, aluminum is preferred. The letters c, d, and e each independently indicate an integer of 1 to 3. In view of fire retardancy, c, d, and e are 3, 2, and 3, respectively, and $c \times d = 2 \times e$ is preferably satisfied.

[Chemical Formula 17]

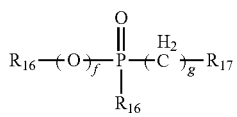
(P-4)

in General Formula (P-4) above, $R_{16}$ each independently represent an alkyl group, an aryl group, an aralkyl group, or a cycloalkyl group with a carbon number of 1 to 12 and, in view of heat resistance, are each independently preferably a phenyl group. A cyclic structure may be formed together with a phosphorus atom. $R_{17}$ represents a vinyl group, a vinyl benzyl group, or a (meth)acryloyloxy group and, in view of a low dielectric loss tangent, is preferably a vinyl group or a vinyl benzyl group. The letters f and g each independently indicate 0 or 1. Examples of the phosphorus-based fire retardant forming a cyclic structure together with a phosphorus atom include General Formula (P1) below:

[Chemical Formula 18]

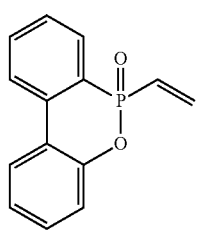
(P1)

[Chemical Formula 19]

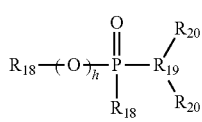
(P-5)

in General Formula (P-5) above, $R_{18}$ each independently represent an alkyl group, an aryl group, an aralkyl group, or a cycloalkyl group with a carbon number of 1 to 12 and, in view of heat resistance, are each independently preferably a phenyl group. A cyclic structure may be formed together with a phosphorus atom. $R_{19}$ represents a divalent group having an arylene structure and, in view of heat resistance, is preferably a phenyl group. $R_{20}$ represents a (meth)acryloyloxy group, a vinylbenzyl ether group, or an allyl ether group and, in view of a low dielectric loss tangent, is preferably a vinylbenzyl ether group. The letter h indicates 0 or 1. Examples of the phosphorus-based fire retardant forming a cyclic structure together with a phosphorus atom include General Formula (P2) below:

[Chemical Formula 20]

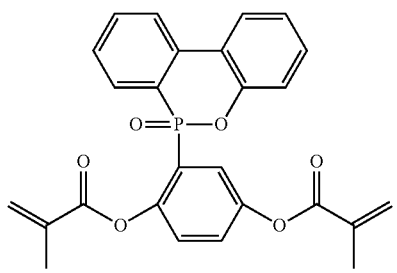

(P2)

The curable resin composition of the present invention preferably contains the (C) component in an amount of 0.05 to 300 parts by mass, more preferably contains it in an amount of 0.1 to 200 parts by mass, even more preferably contains it in an amount of 1 to 100 parts by mass, and further preferably contains it in an amount of 5 to 50 parts by mass with respect to 100 parts by mass of the (A) component. When the content of the (C) component is 0.05 part by mass or more, the obtained cured product has excellent fire retardancy, and when the content is 300 parts by mass or less, deterioration of dielectric properties can be inhibited, which is preferred.

Other Resins and Others

For the curable resin composition of the present invention, in addition to the (A) component, the (B) component, the (C) component, and the (D) component, other resins, curing agents, curing accelerators, or the like can be used without particular limitations to the extent that they do not impair the purpose of the present invention. Although the curable resin composition can produce a cured product by heating or the like without blending any curing agent or curing accelerator, when blended with the (D) component and the like in combination, for example, a curing agent, a curing accelerator, or the like can be separately blended.

Other Resins

Not only the (A) component and the (D) component, thermoplastic resins may also be blended as needed. Examples of the thermoplastic resins include styrene-butadiene resins, styrene-butadiene-styrene block resins, styrene-isoprene-styrene resins, styrene-maleic anhydride resins, acrylonitrile butadiene resins, polybutadiene resins and their hydrogenated resins, acrylic resins, and silicone resins. By using the thermoplastic resins, properties caused by the resins can be imparted to the cured product, which is a preferred mode. As the properties that can be imparted, they can contribute to imparting formability, high-frequency properties, conductor adhesiveness, soldering heat resistance, adjustment of glass transition temperature, the coefficient of thermal expansion, and smear removability, for example.

Curing Agent

Examples of the curing agents include amine-based compounds, amide-based compounds, acid anhydride-based compounds, phenolic compounds, and cyanate ester compounds. These curing agents may be used alone, or two or more may be used in combination.

Curing Accelerator

Various types of curing accelerators can be used. Examples thereof include phosphorus-based compounds, tertiary amines, imidazoles, organic acid metal salts, Lewis acids, and amine complex salts. When used for semiconductor sealing materials in particular, phosphorus-based compounds such as triphenylphosphine or imidazoles are preferred due to their excellent curability, heat resistance, electric properties, moisture resistance reliability, and the like. These curing accelerators can be used alone, or two or more can be used in combination.

Examples of the curing accelerator, when using an epoxy resin as the (D) component in the curable resin composition, include organic phosphine compounds: TPP, TPP-K, TPP-S, TPTP-S (Hokko Chemical Industry Co., Ltd.), amines: dicyandiamide, diaminodiphenylethane, guanylurea, amine adduct compounds such as Novacure (Asahi Kasei Corporation) and Fujicure (Fuji Kasei Kogyo Co., Ltd.), 1,8-diazabicyclo[5,4,0]undecene-7,4-dimethylaminopyridine (DMAP), benzyl dimethylamine, and 2,4,6-tris(dimethylaminomethyl)phenol, and imidazoles: 2-phenylimidazole, 1-cyanoethyl-2-methylimidazole, 1-cyanoethyl-2-undecylimidazole, 1-cyanoethyl-2-phenylimidazole, 1-cyanoethyl-2 phenylimidazolium trimellitate, benzoimidazole, and Curezol 2MZ, 2E4MZ, C11Z, C11Z-CN, C11Z-CNS, C11Z-A, 2MZ-OK, 2MA-OK, and 2PHZ (Shikoku Chemicals Corporation). Examples thereof, when using a maleimide resin as the (D) component, include acid catalysts: p-toluenesulfonic acid, amine compounds: triethylamine, pyridine, tributylamine, tertiary amine compounds; quaternary ammonium compounds, and imidazole compounds, phosphorus-based compounds, organic peroxides: dicumylperoxide, 2,5-dimethyl-2,5-bis(t-butylperoxy)hexyne-3,2, 5-dimethyl-2,5-bis(t-butylperoxy)hexane, t-butylperoxyisopropyl monocarbonate, and α,α'-bis(t-butylperoxy) diisopropylbenzene, carboxylates: manganese, cobalt, and zinc. Examples thereof, when using a cyanate ester resin as the (D) component, include imidazole compounds and derivatives thereof, carboxylates of manganese, cobalt, zinc, and the like; and organometallic compounds such as acetylacetone complexes of transition metals such as manganese, cobalt, and zinc.

Inorganic Filler

The curable resin composition of the present invention can be blended with inorganic fillers as needed. Examples of the inorganic fillers include silica (fused silica and crystalline silica), alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate, and calcium zirconate. Surface treatment may be performed with silane coupling agents. When the blending amount of the inorganic fillers is made especially large, fused silica is preferably used. For the fused silica, although both crushed one and spherical one can be used, it is preferable to use mainly the spherical one in order to increase the blending amount of the fused silica and to inhibit an increase in the melt viscosity of the molding material. To further increase the blending amount of the spherical silica, the particle size distribution of the spherical silica is preferably appropriately adjusted.

Other Compounding Agents

Various compounding agents such as silane coupling agents, mold release agents, pigments, and emulsifiers can be added to the curable resin composition of the present invention as needed.

Cured Product

The present invention relates to a cured product obtained by subjecting the curable resin composition to a curing reaction. The curable resin composition is obtained by uniformly mixing together the (D) component and the components such as the curing agents in accordance with the purpose in addition to the (A) component, the (B) component, and the (C) component and can be easily made into a cured product by the same method as conventionally known methods. Examples of the cured product include molded cured products such as laminates, cast products, adhesive layers, coatings, and films.

Examples of the curing reaction include heat curing and ultraviolet curing reactions, among which the heat curing reaction is easily carried out under a non-catalyst condition, but using the (B) component enables the reaction to proceed even quickly. In addition to the (B) component, other polymerization initiators, catalysts, and the like can also be used.

Varnish

The present invention relates to a varnish obtained by diluting the curable resin composition with an organic solvent. As the method for preparing the varnish, known methods can be used, and it can be made into a resin varnish with the curable resin composition dissolved (diluted) in an organic solvent.

Prepreg

The present invention relates to a prepreg having a reinforcing base material and a semi-cured product of the varnish impregnated into the reinforcing base material. The varnish (resin varnish) is impregnated into the reinforcing base material, and the reinforcing material impregnated with the varnish (resin varnish) is subjected to heat treatment to make the curable resin composition semi-cured (or uncured), and thereby the prepreg can be made.

Examples of the organic solvent include toluene, xylene, N,N-dimethylformamide, N,N-dimethylacetamide, N-methyl-2-pyrrolidone, methyl ethyl ketone (MEK), methyl isobutyl ketone, dioxane, and tetrahydrofuran, which can be used alone or as a mixed solvent of two or more.

Examples of the reinforcing base material into which the varnish (resin varnish) is impregnated include woven and non-woven fabrics, mats, and paper made of inorganic fibers and organic fibers such as glass fibers, polyester fibers, and polyamide fibers, which can be used alone or in combination.

The mass ratio of the curable resin composition and the reinforcing base material in the prepreg, which is not limited to a particular ratio, is usually preferable to prepare (the resin content in) the curable resin composition in the prepreg to be 20 to 60% by mass.

The conditions for the heat treatment for the prepreg are selected as appropriate in accordance with the types and amounts of organic solvents, catalysts, and various additives used. It is usually performed under conditions including 3 to 30 minutes at a temperature of 80 to 220° C.

Laminate

The present invention relates to a laminate having a base material and a layer containing the cured product. The laminate formed from the layer containing the cured product (a cured product layer) has a low dielectric constant, a low dielectric loss tangent, and high heat resistance and can thus be used for high-frequency printed circuit boards and the like, which is preferred.

As the base material for use in the laminate, inorganic materials such as metal and glass and organic materials such as plastic and wood may be used as appropriate depending on the use. Examples thereof include glass fibers: E glass, D glass, S glass, Q glass, spherical glass, NE glass, L glass, and T glass, inorganic fibers: quarts, wholly aromatic polyamides: polyparaphenylene terephthalamide (Kevlar (registered trademark) manufactured by DuPont) and copolyparaphenylene.3,4'-oxydiphenylene.terephthalamide (Technora (registered trademark) manufactured by Teijin Techno Products Limited), polyesters: 2,6-hydroxynaphthoic acidp-hydroxybenzoic acid (Vectran (registered trademark) manufactured by Kuraray Co., Ltd.), and Zxion (registered trademark) manufactured by KB Seiren LTD.), organic fibers: polyparaphenylene benzoxazole (Zylon (registered trademark) manufactured by Toyobo Co., Ltd.) and polyimides.

The shape of the laminate may be flat, sheet-like, three-dimensional, or steric. It may be of any shape to suit the purpose, such as having curvature on the entire or part of the surface. There are no limitations on the hardness, thickness, and the like of the base material. The cured product of the present invention may be used as the base material and the cured product of the present invention may be further laminated thereon.

When the laminate is used for circuit boards or semiconductor package substrates, it is preferable to laminate metal foil thereon. Examples of the metal foil include copper foil, aluminum foil, gold foil, and silver foil, and copper foil is preferably used because of its good processability.

In the above laminate, the layer containing the cured product (the cured product layer) may be formed by direct application or molding onto the base material, or already molded one may be laminated thereon. In the case of direct application, there are no particular limitations on the method of application. Examples thereof include spraying, spin coating, dipping, roll coating, blade coating, doctor rolling, doctor blading, curtain coating, slit coating, screen printing, and inkjetting. In the case of direct molding, examples thereof include in-mold molding, insert molding, vacuum molding, extrusion laminate molding, and press molding.

A precursor that can be the base material may be applied and cured to be laminated on the cured product of the present invention, or the precursor that can be the base material or the curable resin composition of the present invention, in an uncured or semi-cured state, may be bonded together and then cured. There are no particular limitations on the precursor that can be the base material, and various curable resin compositions can also be used.

Uses

The cured product obtained by the curable resin composition of the present invention has excellent fire retardancy, heat resistance, and dielectric properties and can thus suitably be used for heat-resistant members and electronic members. It can be particularly suitably used for varnishes for use in the manufacture of prepregs, circuit boards, semiconductor sealing materials, semiconductor devices, build-up films, build-up boards, adhesives, and resist materials. It can also be suitably used for matrix resins of fiber-reinforced resins and is particularly suitable as prepregs with fire retardancy and high heat resistance. The thus obtained heat-resistant members and electronic members can be suitably used for various uses including, but not limited to, industrial machine parts, general machine parts, parts for automobiles, railways, vehicles, and the like, space and aviation-related parts, electronic and electric parts, construction materials, container and packaging members, household goods, sports and leisure goods, and housing members for wind power generation.

The following describes representative products manufactured using the curable resin composition of the present invention with reference to examples.

Circuit Board

The present invention relates to a circuit board obtained by laminating and thermocompression molding the prepreg and copper foil to each other. Specific examples of the method for obtaining a circuit board from the curable resin composition of the present invention include a method of laminating the prepregs on each other in a usual way, overlaying the copper foil thereon as appropriate, and thermocompression molding them to each other under a pressure of 1 to 10 MPa at 170 to 300° C. for 10 minutes to 3 hours.

Semiconductor Sealing Material

The semiconductor sealing material preferably contains the curable resin composition. Specifically, examples of the method for obtaining semiconductor sealing material from the curable resin composition of the present invention include a method of thoroughly melting and mixing compounding agents such as curing accelerators and inorganic fillers as optional components into the curable resin composition until they become uniform using an extruder, a kneader, a roll, or the like as needed. In such a case, fused silica is usually used as the inorganic filler. When used as a high thermal conductivity semiconductor sealing material for power transistors and power ICs, crystalline silica, alumina, silicon nitride, or the like, which has higher thermal conductivity than fused silica. As its filling ratio, the inorganic filler is preferably used in a range of 30 to 95 parts by mass with respect to 100 parts by mass of the curable resin composition. In particular, to improve fire retardancy, moisture resistance, and solder cracking resistance and to lower the coefficient of linear expansion, it is more preferably 70 parts by mass or more and even more preferably 80 parts by mass or more.

Semiconductor Device

The semiconductor device preferably includes a cured product obtained by heating and curing the semiconductor sealing material. Specifically, examples of semiconductor package molding to obtain the semiconductor device from the curable resin composition of the present invention include a method of molding the semiconductor sealing material by pouring or using a transfer molding machine, an injection molding machine, or the like and further heating and curing it at 50 to 250° C. for 2 to 10 hours.

Build-Up Board

Examples of the method for obtaining a build-up board from the curable resin composition of the present invention include a method passing through Steps 1 to 3. In Step 1, the curable resin composition, which is blended with rubber, fillers, or the like as appropriate, is first applied to a circuit board formed with a circuit using spray coating, curtain coating, or the like and is then cured. In Step 2, as needed, after drilling a certain through hole part or the like in the circuit board to which the curable resin composition has been applied, the circuit board is treated with a roughening agent and its surface is rinsed with hot water to form unevenness on the board, which is then plated with metal such as copper. In Step 3, the operations of Steps 1 and 2 are sequentially repeated as desired to alternately build up a resin insulation layer and a conductor layer with a certain circuit pattern to form a build-up board. In the above step, drilling of the through hole part may be performed after the formation of the outermost resin insulating layer. In the build-up board in the present invention, the build-up board can also be produced by thermocompression molding copper foil with a resin, in which the resin composition is semi-cured on copper foil, onto a wiring board formed with a circuit at 170 to 300° C. to form a roughened surface, with the plating step omitted.

Build-Up Film

The build-up film preferably contains the curable resin composition. Examples of the method for obtaining the build-up film from the curable resin composition of the present invention include a method of applying the curable resin composition onto a support film and then drying it to form a resin composition layer on the support film. When the curable resin composition of the present invention is used for the build-up film, it is important that the film is softened under a temperature condition of lamination in vacuum lamination (usually 70 to 140° C.) and to exhibit flowability (resin flow) enabling resin filling in via holes or through holes present in the circuit board at the same time as the lamination of the circuit board, and it is preferable to blend the above components so as to exhibit such characteristics.

Here, the diameter and the depth of the through holes in the circuit board are usually 0.1 to 0.5 mm and 0.1 to 1.2 mm, respectively, and it is usually preferable to enable resin filling within these ranges. When laminating both sides of the circuit board, it is desirable to fill about ½ of the through holes.

Specific examples of the method for manufacturing the build-up film described above include a method of preparing a resin composition varnished by blending an organic solvent, then applying the varnished resin composition to the surface of a support film (Y), and drying the organic solvent by heating, hot air blowing, or the like to form a resin composition layer (X).

Preferred examples of the organic solvent used here include ketones such as acetone, methyl ethyl ketone, and cyclohexanone, acetates such as ethyl acetate, butyl acetate, cellosolve acetate, propylene glycol monomethyl ether acetate, and carbitol acetate, cellosolve, carbitols such as butyl carbitol, aromatic hydrocarbons such as toluene and xylene, dimethylformamide, dimethylacetamide, and N-methylpyrrolidone, which are preferably used at a ratio of a non-volatile content of 30 to 60% by mass.

The thickness of the resin composition layer (X) to be formed is usually required to be the thickness of the conductor layer or more. The thickness of the conductor layer that the circuit board has is usually in a range of 5 to 70 μm, and thus the thickness of the resin composition layer (X) preferably has a thickness of 10 to 100 μm. The resin composition layer (X) in the present invention may be protected by a protective film, which is described below. Protection by the protective film can prevent dust and the like from adhering to the surface of the resin composition layer or scratches thereon.

Examples of the support film and the protective film include polyolefins such as polyethylene, polypropylene, and polyvinyl chloride, polyesters such as polyethylene terephthalate (PET) and polyethylene naphthalate, polycarbonates, polyimides, and even mold release paper and metal foil such as copper foil and aluminum foil. The support film and the protective film may be treated with mold release treatment in addition to mad treatment and corona treatment. The thickness of the support film, which is not limited to a particular thickness, is usually 10 to 150 μm and is preferably used in a range of 25 to 50 μm. The thickness of the protective film is preferably 1 to 40 μm.

The support film (Y) is peeled off after being laminated onto the circuit board or after forming an insulating layer by heat curing. If the support film (Y) is peeled off after the resin composition layer forming the build-up film is heat cured, adhesion of dust and the like during the curing step can be prevented. When being peeled off after curing, the support film is usually treated with mold release treatment in advance.

A multilayer printed circuit board can be manufactured from the build-up film obtained as described above. When the resin composition layer (X) is protected by the protective films, for example, these are peeled off, and then the resin composition layer (X) is laminated to one or both sides of the circuit board so as to be in direct contact with the circuit board by vacuum lamination, for example. The method of lamination may be a batch type or a continuous type with rolls. If necessary, the build-up film and the circuit board may be heated (preheated) as required before performing lamination. As the conditions for lamination, the compression bonding temperature (lamination temperature) is preferably 70 to 140° C., the compression bonding pressure is preferably 1 to 11 kgf/cm$^2$ ($9.8 \times 10^4$ to $107.9 \times 10^4$ N/m$^2$), and lamination is preferably performed with air pressure reduced to 20 mmHg (26.7 hPa) or less.

Conductive Paste

Examples of the method for obtaining a conductive paste from the curable resin composition of the present invention include a method of dispersing conductive particles in the composition. The conductive paste can be a paste resin composition for circuit connection or an anisotropic conductive adhesive, depending on the type of the used conductive particles.

EXAMPLES

The following describes the present invention specifically by means of examples and comparative examples, in which "part(s)" and "%" are on a mass basis unless otherwise specified. Curable resins (simply referred to as a "resin" in Comparative Example 1) and cured products obtained using the curable resins (or the resin) were prepared under the following conditions, and furthermore, the obtained cured products were measured and evaluated under the following conditions.

GPC Measurement (Evaluation of Weight Average Molecular Weight (Mw) of Curable Resin Measurement was conducted using the following measurement apparatus and measurement conditions to obtain GPC charts of the curable resins obtained by the method of synthesis indicated below. The weight average molecular weights (Mw) of the curable resins were calculated from the results of the GPC charts (the GPC charts are not illustrated).

Measurement apparatus: "HLC-8320 GPC" manufactured by Tosoh Corporation

Column: Guard column "HXL-L" manufactured by Tosoh Corporation+"TSK-GEL G2000HXL" manufactured by Tosoh Corporation+"TSK-GEL G2000HXL" manufactured by Tosoh Corporation+"TSK-GEL G3000HXL" manufactured by Tosoh Corporation+"TSK-GEL G4000HXL" manufactured by Tosoh Corporation Detector: RI (differential refractometer)

Data processing: "GPC Workstation EcoSEC-WorkStation" manufactured by Tosoh Corporation Measurement conditions: Column temperature 40° C.

Developing solvent tetrahydrofuran

Flow rate 1.0 ml/minute

Standard: The following monodispersed polystyrenes of known molecular weights were used in conformity with the measurement manual of the "GPC Workstation EcoSEC-WorkStation".

Polystyrenes Used

"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: A microfiltered tetrahydrofuran solution (50 μl) of 1.0% by mass in terms of the solid content of the curable resins obtained in the examples and the comparative examples Example 1

Into a reaction vessel equipped with a stirrer, charged were 113.8 parts by mass of 2,2-bis(4-hydroxy-3,5-dimethylphenyl)propane, 64.0 parts by mass of sodium hydroxide, 0.25 part by mass of tri-n-butylbenzylammonium chloride, and 2,000 parts by mass of pure water, which were dissolved to prepare an aqueous phase. In 1,500 parts by mass of methylene chloride, 30.5 parts by mass of terephthaloyl dichloride, 30.5 parts by mass of isophthaloyl dichloride, and 20.9 parts by mass of methacryloyl chloride were dissolved to prepare an organic phase.

With the aqueous phase stirred in advance, the organic phase was added to the aqueous phase under strong stirring and reacted at 20° C. for 5 hours. Subsequently, the stirring was stopped, the aqueous phase and the organic phase were separated from each other, and the organic phase was washed 10 times with pure water. Subsequently, methylene chloride was distilled under reduced pressure from the organic phase using an evaporator, and the polymer obtained by the reaction was dried and solidified. The obtained polymer was dried under reduced pressure to obtain a curable resin with a weight average molecular weight of 3,100 having the following repeating unit and having a methacryloyloxy group at the end:

[Chemical Formula 21]

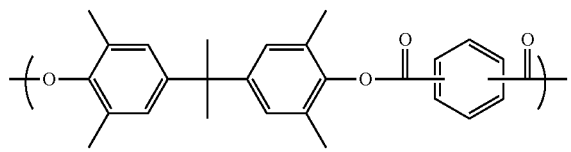

Example 2

Synthesis was carried out in the same manner as in Example 1 above except that 2,2-bis(4-hydroxy-3,5-dimethylphenyl)propane in Example 1 above was changed to 102.5 parts by mass of bis(4-hydroxy-3,5-dimethylphenyl)methane to obtain a curable resin with a weight average molecular weight of 2,900 having the following repeating unit and having a methacryloyloxy group at the end:

[Chemical Formula 22]

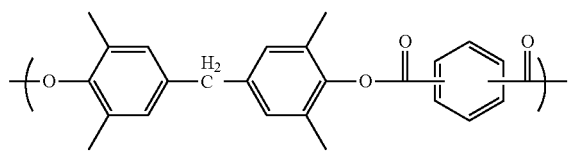

Example 3

Synthesis was carried out in the same manner as in Example 1 above except that 2,2-bis(4-hydroxy-3,5-dimethylphenyl)propane in Example 1 above was changed to 141.0 parts by mass of 2,2-bis(2-hydroxy-5-biphenylyl)propane to obtain a curable resin with a weight average molecular weight of 3,200 having the following repeating unit and having a methacryloyloxy group at the end:

[Chemical Formula 23]

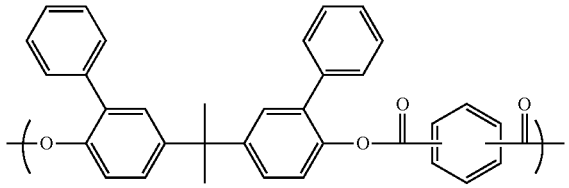

Example 4

Synthesis was carried out in the same manner as in Example 1 above except that 2,2-bis(4-hydroxy-3,5-dimethylphenyl)propane in Example 1 above was changed to 157.0 parts by mass of 2,2-bis(4-hydroxy-3-cyclohexyl-6-methylphenyl)propane to obtain a curable resin with a weight average molecular weight of 3,200 having the following repeating unit and having a methacryloyloxy group at the end:

[Chemical Formula 24]

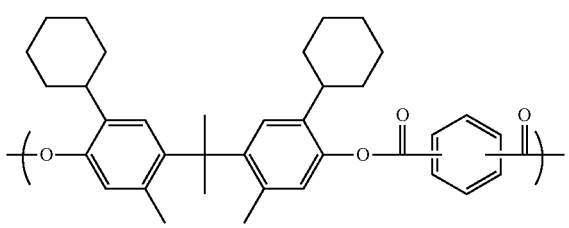

Example 5

Synthesis was carried out in the same manner as in Example 1 above except that 2,2-bis(4-hydroxy-3,5-dimethylphenyl)propane in Example 1 above was changed to 113.8 parts by mass of 2,2-bis(4-hydroxy-3,5,6-trimethylphenyl)propane to obtain a curable resin with a weight average molecular weight of 3,100 having the following repeating unit and having a methacryloyloxy group at the end:

[Chemical Formula 25]

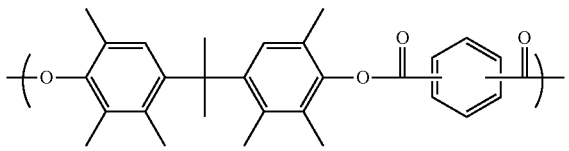

Example 6

Synthesis was carried out in the same manner as in Example 1 above except that 2,2-bis(4-hydroxy-3,5-dimethylphenyl)propane in Example 1 above was changed to 129.8 parts by mass of 1,1-bis(4-hydroxy-3,5-dimethylphenyl)cyclohexane to obtain a curable resin with a weight average molecular weight of 3,100 having the following repeating unit and having a methacryloyloxy group at the end:

[Chemical Formula 26]

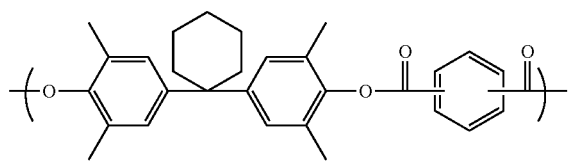

Example 7

Synthesis was carried out in the same manner as in Example 1 above except that 2,2-bis(4-hydroxy-3,5-dimethylphenyl)propane in Example 1 above was changed to 161.0 parts by mass of 1,4-bis(2-(4-hydroxy-3,5-dimethylphenyl)-2-propyl)benzene to obtain a curable resin with a weight average molecular weight of 3,500 having the following repeating unit and having a methacryloyloxy group at the end:

[Chemical Formula 27]

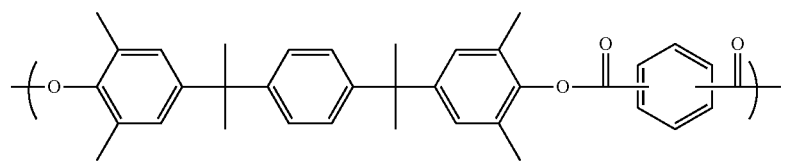

Example 8

Synthesis was carried out in the same manner as in Example 1 above except that terephthaloyl dichloride and isophthaloyl dichloride in Example 1 above were changed to 62.7 parts by mass of 1,4-cyclohexanedicarboxylic acid dichloride to obtain a curable resin with a weight average molecular weight of 3,100 having the following repeating unit and having a methacryloyloxy group at the end:

[Chemical Formula 28]

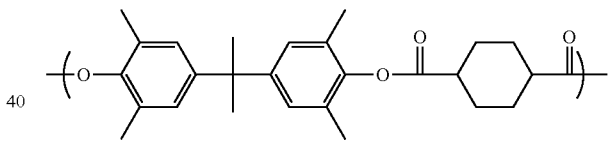

Example 9

Synthesis was carried out in the same manner as in Example 1 above except that terephthaloyl dichloride and isophthaloyl dichloride in Example 1 above were changed to 88.5 parts by mass of diphenyl ether-4,4'-dicarboxylic acid dichloride to obtain a curable resin with a weight average molecular weight of 3,500 having the following repeating unit and having a methacryloyloxy group at the end:

[Chemical Formula 29]

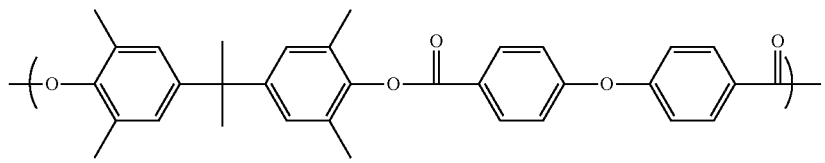

Example 10

Into a reaction vessel equipped with a stirrer, a distillation column, and a pressure reducing device, charged were 113.8 parts by mass of 2,2-bis(4-hydroxy-3,5-dimethylphenyl)propane, 64.2 parts by mass of diphenyl carbonate, and 0.01 part by mass of tetramethylammonium hydroxide, which were dissolved at 140° C. after performing nitrogen purging. After stirring for 30 minutes, the internal temperature was increased to 180° C., and the mixture was reacted at an internal pressure of 100 mmHg for 30 minutes to distill off phenol that was generated. Subsequently, while increasing the internal temperature to 200° C., the pressure was gradually reduced, and the mixture was reacted at 50 mmHg for 30 minutes while distilling off the phenol. Furthermore, the temperature was gradually increased to 220° C. and the pressure was gradually reduced to 1 mmHg, and the mixture was reacted under the conditions of the same temperature and the same pressure for 30 minutes. The obtained solid was washed with methanol and dried under reduced pressure to give an intermediate compound.

In a 200 mL flask equipped with a thermometer, a cooling tube, and a stirrer, 20 g of toluene and 22 g of the intermediate compound were mixed together and heated to about 85° C. Dimethylaminopyridine in an amount of 0.19 g was added thereto. When all the solids appeared to be dissolved, 30.6 g of methacrylic anhydride was gradually added thereto. The obtained solution was maintained at 85° C. for 3 hours with continuous mixing. Next, the solution was cooled to room temperature and added dropwise into methanol, which was vigorously stirred with a magnetic stirrer in a 1 L beaker. The obtained precipitate was filtered out under reduced pressure and dried to obtain a curable resin with a weight average molecular weight of 2,700 having the following repeating unit and having a methacryloyloxy group at the end.

[Chemical Formula 30]

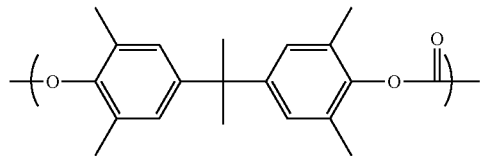

Example 11

Synthesis was carried out in the same manner as in Example 1 above except that methacryloyl chloride in Example 1 above was changed to 30.5 parts by mass of chloromethylstyrene to obtain a curable resin with a weight average molecular weight of 3,100 having the following repeating unit and having a vinylbenzyl ether group at the end:

[Chemical Formula 31]

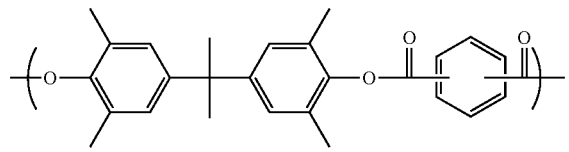

Example 12

Synthesis was carried out in the same manner as in Example 1 above except that methacryloyl chloride in Example 1 above was changed to 15.3 parts by mass of allyl chloride to obtain a curable resin with a weight average molecular weight of 3,100 having the following repeating unit and having an allyl ether group at the end:

[Chemical Formula 32]

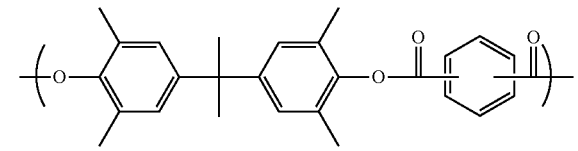

Comparative Example 1

Into a reaction vessel equipped with a stirrer, charged were 113.8 parts by mass of 2,2-bis(4-hydroxy-3,5-dimethylphenyl)propane, 64.0 parts by mass of sodium hydroxide, 0.25 part by mass of tri-n-butylbenzylammonium chloride, and 2,000 parts by mass of pure water, which were dissolved to prepare an aqueous phase. In 1,500 parts by mass of methylene chloride, 30.5 parts by mass of terephthaloyl dichloride and 30.5 parts by mass of isophthaloyl dichloride were dissolved to prepare an organic phase.

With the aqueous phase stirred in advance, the organic phase was added to the aqueous phase under strong stirring and reacted at 20° C. for 5 hours. Subsequently, the stirring was stopped, the aqueous phase and the organic phase were separated from each other, and the organic phase was washed with a 10% aqueous acetic acid solution and then further washed 10 times with pure water. Subsequently, methylene chloride was distilled under reduced pressure from the organic phase using an evaporator, and the polymer obtained by the reaction was dried and solidified. The obtained polymer was dried under reduced pressure to obtain a resin with a weight average molecular weight of 2,800 having the following repeating unit and having a phenyl group at the end.

[Chemical Formula 33]

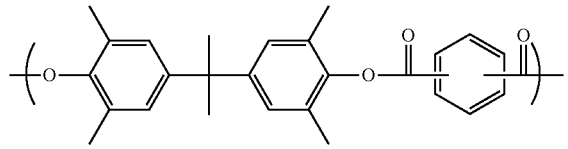

Comparative Example 2

Synthesis was carried out in the same manner as in Example 1 above except that 2,2-bis(4-hydroxy-3,5-dimethylphenyl)propane in Example 1 above was changed to 91.3 parts by mass of 2,2-bis(4-hydroxyphenyl)propane to obtain a curable resin with a weight average molecular weight of 3,000 having the following repeating unit and having a methacryloyloxy group at the end:

[Chemical Formula 34]

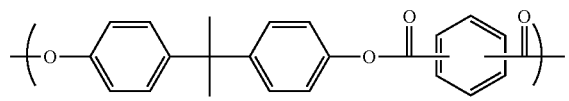

Production of Resin Film (Cured Product)

Each of the curable resins obtained in the examples and the comparative examples was put into a 5-cm square mold frame, was held between stainless plates, and was set in a vacuum press. It was pressurized to 1.5 MPa under normal pressure and temperature. Next, the pressure was reduced to 10 torr and was then heated to a temperature 50° C. above a thermal curing temperature over 30 minutes. After being left at rest for 2 hours, it was gradually cooled to room temperature to obtain a uniform resin film (cured product) with an average thickness of 100 μm.

Evaluation of Heat Resistance (Glass Transition Temperature)

For the obtained resin film (cured product), using a DSC apparatus (Pyris Diamond) manufactured by Perkin Elmer, a peak exothermic temperature (a thermal curing temperature) observed when measured at a temperature increase condition of 20° C./minute from 30° C. was observed, and then it was held at a temperature 50° C. above it for 30 minutes. Next, the sample was cooled to 30° C. at a temperature decrease condition of 20° C./minute, and furthermore, the temperature was again increased at a temperature increase condition of 20° C./minute to measure the glass transition temperature (Tg) (° C.) of the resin film (the cured product).

As to the glass transition temperature (Tg), if it is 100° C. or higher, there is no problem in practical use, and it is preferably 150° C. or higher and more preferably 190° C. or higher.

TABLE 1

|  | Examples | | | | | | | | | | | Comparative Examples | |
| --- | --- | --- | --- | --- | --- | --- | --- | --- | --- | --- | --- | --- | --- |
|  | 13 | 14 | 15 | 16 | 17 | 18 | 19 | 20 | 21 | 22 | 23 | 3 | 4 |
| Used curable resin (resin) | Example 1 | Example 2 | Example 3 | Example 4 | Example 5 | Example 6 | Example 7 | Example 8 | Example 9 | Example 10 | Example 11 | Comparative Example 1 | Comparative Example 2 |
| Dielectric loss tangent ($\times 10^{-3}$) | 2.0 | 1.9 | 2.5 | 2.3 | 2.0 | 2.0 | 2.0 | 2.1 | 2.6 | 2.2 | 3.0 | 15.0 | 12.0 |
| Dielectric constant | 2.4 | 2.3 | 2.5 | 2.4 | 2.4 | 2.3 | 2.3 | 2.2 | 2.6 | 2.4 | 2.5 | 3.1 | 3.0 |
| Glass transition temperature Tg (° C.) | 190 | 200 | 190 | 185 | 195 | 140 | 145 | 135 | 130 | 130 | 185 | 160 | 130 |

The resin obtained in Comparative Example 1, unlike the other examples and comparative examples, does not undergo self-cure, and thus an epoxy resin (jER 828, a bisphenol A type epoxy resin manufactured by Mitsubishi Chemical Corporation) and the resin obtained in Comparative Example 1 (a terminal hydroxy group-containing phenolic resin) were blended in such a manner that the phenolic hydroxy group equivalent/epoxy equivalent was 1, and further 0.2 part by mass of 2-ethyl-4-methylimidazole as a curing catalyst was blended with respect to 100 parts by mass of the resin (the total of all resins) to obtain a resin film (cured product).

Evaluation of Dielectric Properties

As to the dielectric properties of the obtained resin film (cured product) in the in-plane direction, a dielectric constant and a dielectric loss tangent were measured at a frequency of 10 GHz by the split-post dielectric resonator method using a network analyzer N5247A of Keysight Technologies.

As to the dielectric loss tangent, if it is $10.0 \times 10^{-3}$ or less, there is no problem in practical use, and it is preferably $3.0 \times 10^{-3}$ or less and more preferably $2.5 \times 10^{-3}$ or less.

As to the dielectric constant, if it is 3 or less, there is no problem in practical use, and it is preferably 2.7 or less and more preferably 2.5 or less.

Preparation of Curable Resin Composition

Using the curable resins obtained in the examples and the comparative examples, based on the curable resin compositions with the blending details (raw materials and blending amounts) listed in Table 2 and Table 3 below and the conditions described below (temperature, time, and the like), samples for evaluation (resin films (cured products)) were prepared, which were evaluated as examples and comparative examples. For the curable resins listed in Table 2 and Table 3, specifically, the curable resin obtained in Example 1 was named a curable resin (A1), the curable resin obtained in Example 2 was named a curable resin (A2), the curable resin obtained in Example 11 was named a curable resin (A3), and the curable resin obtained in Comparative Example 2 was named a curable resin (A4).

Production of Resin Film (Cured Product)

Each of the curable resin compositions with the blending details listed in Table 2 and Table 3 below was put into a 10-cm square mold frame, was held between stainless plates, and was set in a vacuum press. It was pressurized to 1.5 MPa under normal pressure and 30° C. Next, the pressure was reduced to 10 torr, was then heated to 100° C. over 30 minutes, and was then left at rest for 1 hour. The temperature was then increased to 220° C. over 30 minutes and was left at rest for 2 hours. It was then slowly cooled to 30° C. A uniform resin film (cured product) with an average film thickness of 100 μm was produced.

Evaluation of Heat Resistance (Glass Transition Temperature)

For the obtained resin film (cured product), using a DSC apparatus (Pyris Diamond) manufactured by Perkin Elmer, a peak exothermic temperature (a thermal curing temperature) observed when measured at a temperature increase condition of 20° C./minute from 30° C. was observed, and then it was held at a temperature 50° C. above it for 30 minutes. Next, the sample was cooled to 30° C. at a temperature decrease condition of 20° C./minute, and furthermore, the temperature was again increased at a temperature increase condition of 20° C./minute to measure the glass transition temperature (Tg) (° C.) of the resin film (the cured product). As to the glass transition temperature (Tg), if it is 100° C. or higher, there is no problem in practical use, and it is preferably 150° C. or higher and more preferably 200° C. or higher.

Evaluation of Heat Resistance (10% Weight Loss Temperature)

The obtained resin film (cured product) was measured using a TG-DTA apparatus (TG-8120) manufactured by Rigaku Corporation at a temperature increase rate of 20° C./minute under a nitrogen flow of 20 mL/minute to measure a 10% weight loss temperature (Td10). As to the 10% weight loss temperature, if it is 400° C. or higher, there is no problem in practical use, and it is preferably 410° C. or higher and more preferably 420° C. or higher.

Evaluation of Dielectric Properties

As to the dielectric properties of the obtained resin film (cured product) in the in-plane direction, a dielectric constant and a dielectric loss tangent were measured at a frequency of 10 GHz by the split-post dielectric resonator method using a network analyzer N5247A of Keysight Technologies. As to the dielectric loss tangent, if it is $10.0 \times 10^{-3}$ or less, there is no problem in practical use, and it is preferably $3.0 \times 10^{-3}$ or less and more preferably $2.5 \times 10^{-3}$ or less. As to the dielectric constant, if it is 3.0 or less, there is no problem in practical use, and it is preferably 2.7 or less and more preferably 2.5 or less.

Evaluation of Fire Retardancy

The resin films were cut into a strip shape 13 mm wide and 100 mm long to be used as test specimens for evaluating fire retardancy. A UL94, 20 mm vertical combustion test was performed, which was evaluated based on the following criteria. As to the fire retardancy, if it is V-1, there is no problem in practical use, and it is preferably V-0.
○: UL94 V-0
Δ: UL94 V-1
X: UL94 less than V-1
The details of the abbreviations in Table 2 and Table 3 below are listed below.
V5: Katayama Chemical Industries Co., Ltd. V5 (9,10-dihydro-9-oxa-10-vinyl-10-phosphaphenanthrene-10-oxide)
OP930: OP930 (aluminum tris(diethylphosphinate)) manufactured by Clariant Japan K.K.
PX-200: PX-200 (resorcinol bis(di-2,6-xylenylphosphate)) agent manufactured by Daihachi Chemical Industry Co., LTD.
DT-4000: DT-4000 (a dicyclopentadiene type cyanate resin) manufactured by Lonza Japan Ltd.
SA9000: SA9000 (a terminal methacryloyl-modified polyphenylene ether resin) manufactured by SABIC Japan GK.
BMI-5100: BMI-5100 (3,3'-dimethyl-5,5'-diethyl-4,4'-diphenylmethane bismaleimide) manufactured by Daiwa Kasei Industry Co., Ltd.

TABLE 2

| Blending details and evaluation results | | Examples | | | | | | | |
|---|---|---|---|---|---|---|---|---|---|
| | | 24 | 25 | 26 | 27 | 28 | 29 | 30 | 31 |
| A component | A1 | 100 | 100 | 100 | 100 | 100 | 100 | 100 | 100 |
| | A2 | | | | | | | | |
| | A3 | | | | | | | | |
| | A4 | | | | | | | | |
| B component | α,α'-Bis(t-butylperoxy)diisopropylbenzene | 5 | | | 5 | 5 | 5 | 0.01 | 0.1 |
| | 2,5-Dimethyl-2,5-di(t-butylperoxy)hexane | | 5 | | | | | | |
| | 1,1-Bis(t-butyl peroxy)cyclohexane | | | 5 | | | | | |
| C component | V5 | 20 | 20 | 20 | | | | 20 | 20 |
| | OP930 | | | | 20 | | | | |
| | PX-200 | | | | | 20 | | | |
| | 9,10-Dihydro-9-oxa-10-phosphaphenanthrene-10-oxide | | | | | | 20 | | |
| D component | DT-4000 | | | | | | | | |
| | SA9000 | | | | | | | | |
| | BMI-5100 | | | | | | | | |
| | Triallyl isocyanurate | | | | | | | | |
| Performance evaluation | Dielectric loss tangent ($\times 10^{-3}$) | 2.4 | 2.4 | 2.4 | 2.4 | 2.5 | 5.0 | 2.1 | 2.1 |
| | Dielectric constant | 2.5 | 2.5 | 2.5 | 2.5 | 2.5 | 3.0 | 2.4 | 2.4 |
| | Glass transition temperature (° C.) | 205 | 205 | 192 | 200 | 200 | 193 | 195 | 200 |
| | 10% weight loss temperature (° C.) | 420 | 420 | 405 | 420 | 422 | 410 | 400 | 410 |

TABLE 2-continued

| | | | | | | | | | |
|---|---|---|---|---|---|---|---|---|---|
| Fire retardancy | | ○ | ○ | ○ | ○ | ○ | ○ | ○ | ○ |

| | | Examples | | | | | | | |
|---|---|---|---|---|---|---|---|---|---|
| Blending details and evaluation results | | 32 | 33 | 34 | 35 | 36 | 37 | 38 | 39 |
| A component | A1 | 100 | 100 | 100 | 100 | 100 | 100 | 100 | 100 |
| | A2 | | | | | | | | |
| | A3 | | | | | | | | |
| | A4 | | | | | | | | |
| B component | α,α'-Bis(t-butylperoxy)diisopropylbenzene | 10 | 20 | 25 | 5 | 5 | 5 | 5 | 5 |
| | 2,5-Dimethyl-2,5-di(t-butylperoxy)hexane | | | | | | | | |
| | 1,1-Bis(t-butyl peroxy)cyclohexane | | | | | | | | |
| C component | V5 | 20 | 20 | 20 | 0.1 | 1 | 50 | 100 | 200 |
| | OP930 | | | | | | | | |
| | PX-200 | | | | | | | | |
| | 9,10-Dihydro-9-oxa-10-phosphaphenanthrene-10-oxide | | | | | | | | |
| D component | DT-4000 | | | | | | | | |
| | SA9000 | | | | | | | | |
| | BMI-5100 | | | | | | | | |
| | Triallyl isocyanurate | | | | | | | | |
| Performance evaluation | Dielectric loss tangent ($\times 10^{-3}$) | 2.5 | 2.6 | 2.8 | 2.2 | 2.2 | 2.4 | 3.0 | 3.1 |
| | Dielectric constant | 2.5 | 2.6 | 2.7 | 2.4 | 2.4 | 2.5 | 2.7 | 2.8 |
| | Glass transition temperature (° C.) | 205 | 205 | 205 | 200 | 200 | 200 | 190 | 180 |
| | 10% weight loss temperature (° C.) | 425 | 425 | 425 | 420 | 420 | 420 | 410 | 400 |
| | Fire retardancy | ○ | ○ | ○ | Δ | ○ | ○ | ○ | ○ |

TABLE 3

| | | Examples | | | | | | Comparative Examples | | | |
|---|---|---|---|---|---|---|---|---|---|---|---|
| Blending details and evaluation results | | 40 | 41 | 42 | 43 | 44 | 45 | 5 | 6 | 7 | 8 |
| A component | A1 | | | 100 | 100 | 100 | 100 | 100 | 100 | 100 | |
| | A2 | 100 | | | | | | | | | |
| | A3 | | 100 | | | | | | | | |
| | A4 | | | | | | | | | | 100 |
| B component | α,α'-Bis(t-butylperoxy)diisopropylbenzene | 5 | 5 | 5 | 5 | 5 | 5 | | 5 | | 5 |
| | 2,5-Dimethyl-2,5-di(t-butylperoxy)hexane | | | | | | | | | | |
| | 1,1-Bis(t-butyl peroxy)cyclohexane | | | | | | | | | | |
| C component | V5 | 20 | 20 | 20 | 20 | 20 | 20 | | | 20 | 20 |
| | OP930 | | | | | | | | | | |
| | PX-200 | | | | | | | | | | |
| | 9,10-Dihydro-9-oxa-10-phosphaphenanthrene-10-oxide | | | | | | | | | | |
| D component | DT-4000 | | | | 50 | | | | | | |
| | SA9000 | | | | | 50 | | | | | |
| | BMI-5100 | | | | | | 50 | | | | |
| | Triallyl isocyanurate | | | | | | 50 | | | | |
| Performance evaluation | Dielectric loss tangent ($\times 10^{-3}$) | 2.0 | 3.0 | 2.4 | 2.4 | 2.4 | 2.4 | 2.0 | 2.2 | 2.4 | 14 |
| | Dielectric constant | 2.4 | 2.6 | 2.5 | 2.5 | 2.5 | 2.5 | 2.4 | 2.5 | 2.6 | 3.2 |
| | Glass transition temperature (° C.) | 210 | 190 | 220 | 210 | 220 | 230 | 190 | 194 | 190 | 140 |
| | 10% weight loss temperature (° C.) | 425 | 420 | 420 | 425 | 423 | 420 | 390 | 400 | 385 | 420 |
| | Fire retardancy | ○ | ○ | ○ | ○ | ○ | ○ | X | X | Δ | ○ |

From the evaluation results in Table 1 above, it was confirmed that in all the examples the cured products obtained by using the curable resins were able to achieve both heat resistance and low dielectric properties, which were on a level with no practical problem.

On the other hand, from the evaluation results in Table 1 above, it was confirmed that in Comparative Example 3 (using the resin of Comparative Example 1), the use and reaction of the epoxy resin and the terminal hydroxy group-containing phenolic resin caused generation of hydroxy groups, resulting in higher dielectric properties. In Comparative Example 4 (using the curable resin of Comparative Example 2), it was confirmed that the used curable resin did not have a substituent corresponding to Ra in its structure, and thus its dielectric properties were higher than those of the examples.

From the evaluation results in Table 2 and Table 3 above, it was confirmed that in all the examples the cured products obtained by using the curable resins were able to improve in fire retardancy, heat resistance, and low dielectric properties, which were on a level with no practical problem.

On the other hand, from the evaluation results in Table 3 above, cured products were produced using the curable resin composition containing only the (A) component in Comparative Example 5, containing the (A) component and the (B) component in Comparative Example 6, containing only the (A) component and the (C) component in Comparative Example 7, and containing the (A) component without the desired structure (Ra and Rb) in Comparative Example 8, and thus no cured product that simultaneously satisfied all of the fire retardancy, heat resistance, and low dielectric properties was obtained. In Comparative Example 5 and Comparative Example 7 in particular, the (B) component as the radical polymerization initiator was not used, and thus the reactivity reduced, and many low molecular weight components remained therein, resulting in a weight loss during high temperature heating, and it was confirmed that they were inferior in heat resistance. In Comparative Example 5 and Comparative Example 6, the (C) component as the fire retardant was not blended, and thus it was confirmed that they were inferior in fire retardancy. In Comparative Example 8, the (A) component without the desired structure (Ra and Rb) was used, and thus Ra and Rb (especially Ra) as the substituents were not present at the positions adjacent to the reactive group (cross-linking group), and the polarity derived from the reactive group (cross-linking group) was hard to be constrained by the steric hindrance of Ra or the like, and it was inferred that this led to the poor dielectric properties.

INDUSTRIAL APPLICABILITY

The cured product obtained by using the curable resin of the present invention has excellent fire retardancy, heat resistance, and low dielectric properties and can thus suitably be used for heat-resistant members and electronic members. It can be particularly suitably used for prepregs, circuit boards, build-up films, build-up boards, adhesives, and resist materials. It can also be suitably used for matrix resins of fiber-reinforced resins and is suitable as prepregs with high heat resistance.

The invention claimed is:

1. A curable resin consisting of a repeating unit represented by General Formula (1) below and at least one reactive group selected from the group consisting of a (meth) acryloyloxy group, a vinyl benzyl ether group, and an allyl ether group as a terminal structure,

[Chemical Formula 1]

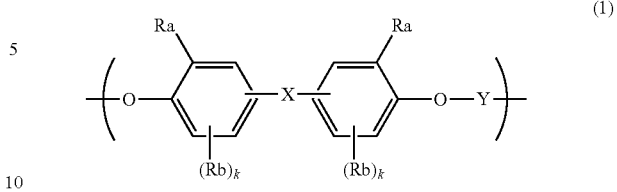

(1)

in the formula, Ra and Rb each independently represent an alkyl group, an aryl group, an aralkyl group, or a cycloalkyl group with a carbon number of 1 to 12; k indicates an integer of 0 to 3; X represents a hydrocarbon group; and Y represents General Formula (2) or (3) below:

[Chemical Formula 2]

(2)

(3)

in the formula, Z represents an alicyclic group, an aromatic group, or a heterocyclic group.

2. The curable resin according to claim 1, wherein General Formula (1) above is a repeating unit represented by General Formula (1A) below:

[Chemical Formula 4]

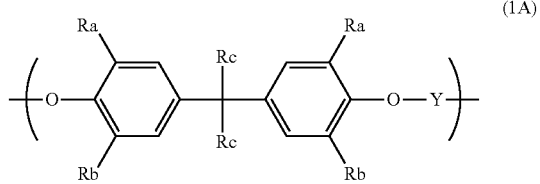

(1A)

in the formula, Rc represents a hydrogen atom or a methyl group.

3. The curable resin according to claim 1, wherein Z is a benzene ring.

4. The curable resin according to claim 1, wherein the reactive group is a methacryloyloxy group.

5. The curable resin according to claim 1, wherein the curable resin has a weight average molecular weight of 500 to 50,000.

6. The curable resin according to claim 1, wherein a cured product of the curable resin has a dielectric constant of 3 or less.

* * * * *